United States Patent [19]
Doidic et al.

[11] Patent Number: 5,789,689
[45] Date of Patent: Aug. 4, 1998

[54] TUBE MODELING PROGRAMMABLE DIGITAL GUITAR AMPLIFICATION SYSTEM

[76] Inventors: Michel Doidic, 7611 Truxton, Los Angeles, Calif. 90045; Michael Mecca, 1210 Appleton Way, Venice, Calif. 90291; Marcus Ryle, 2167 W. Ridge, Los Angeles, Calif. 90049; Curtis Senffner, 1433 17th St. #2, Sta. Monica, Calif. 90404

[21] Appl. No.: 785,004

[22] Filed: Jan. 17, 1997

[51] Int. Cl.$^6$ .................... G10H 1/02; G10H 7/12; H03F 19/00; H03M 1/62

[52] U.S. Cl. .................... 84/603; 84/607; 84/621; 84/629; 84/630; 84/631; 84/633; 341/138; 381/118; 381/120

[58] Field of Search .................... 84/601, 602–607, 84/621, 626–633, 662–665; 330/10, 251; 381/111, 116–118, 120; 379/100; 341/138–140

[56] References Cited

U.S. PATENT DOCUMENTS

| | | | |
|---|---|---|---|
| 3,357,291 | 12/1967 | Carmichael | 84/267 |
| 3,524,143 | 8/1970 | Munch, Jr. | 330/30 |
| 3,539,699 | 11/1970 | Johnson | 84/1.16 |
| 3,683,293 | 8/1972 | Matsui | 330/31 |
| 3,835,409 | 9/1974 | Laub | 330/13 |
| 4,151,477 | 4/1979 | Yokoyama | 330/107 |
| 4,175,462 | 11/1979 | Simon | 84/1.16 |
| 4,194,165 | 3/1980 | Skulski | 252/255 |
| 4,211,893 | 7/1980 | Smith | 179/1 |
| 4,251,688 | 2/1981 | Furner | 179/1 |
| 4,495,640 | 1/1985 | Frey | 381/61 |

(List continued on next page.)

OTHER PUBLICATIONS

Dattorro, Jon, "The Implementation of Recursive Digital Filters for High-Fidelity Audio," Journal of the Audio Engineering Society, 36:11 (1988).

Hirata, Yoshimutsu, "Digitalization of Conventional Analog Filters for Recording Use." Journal of the Audio Engineering Society, 29:5 (1991).

Line 6, AxSys 212 User Manual 1996.

Moorer, James A., "About This Reverberation Business", Computer Music Journal, 3:2 (1979).

Oppenheim and Schaefer, "Allpass Systems", Discrete-Time Signal Processing, pp. 234–240, (Prentice-Hall 1989).

Oppenheim and Schaefer, "Filter Design Technique", Discrete-Time Signal Processing, pp. 403–513, (Prentice-Hall 1989).

Proakis and Manolakis, "Random Number Generators", Digital Signal Processing, B6, (Prentice-Hall, 1996).

Proakis and Manolakis, "Design of Digital Filters", Digital Signal Processing, pp. 614–737, (Prentice-Hall, 1996).

Regallia et al., "The Digital All-Pass Filter: A Versatile Signal Processing Building Block", Proceedings of the IEEE, 76:1 (1988).

Roland, Guital Preamp/Processor GP-100 Owners Manual 1995.

Roland, Guitar Preamp/Processor GP-100 Advertisement 1995.

Stauner and Puckett, "Designing Multi-Channel Reverberators." Computer Music Journal, 6:1 (1982).

Wilson, Rhonda "Filter Topologies", Journal of the Audio Engineering Society, 41:9 (1993).

Primary Examiner—Stanley J. Witkowski
Attorney, Agent, or Firm—Finnegan, Henderson, Farabow, Garrett & Dunner, LLP

[57] ABSTRACT

An electric guitar amplifier which utilizes a digital signal processor to produce vacuum-tube-like distortion without certain unwanted audio artifacts created by previous digital realizations of nonlinear, high-gain functions. By virtue of a microprocessor-controlled digital signal processor embodiment, the invention gives the user programmable control over parameters normally associated with state of the art guitar amplifiers (e.g. tone controls, reverb controls, tremolo controls, etc.), as well as other musically useful parameters which are not normally included among the controls of a guitar amplifier (e.g. selection of preamp type, autovolume, reverberation type, autowah, etc.).

45 Claims, 18 Drawing Sheets

U.S. PATENT DOCUMENTS

| | | | |
|---|---|---|---|
| 4,627,094 | 12/1986 | Scholz | 38/61 |
| 4,809,336 | 2/1989 | Pritchard | 381/61 |
| 4,811,401 | 3/1989 | Brown, Sr. et al. | 381/61 |
| 4,843,390 | 6/1989 | van Bavel et al. | 341/139 |
| 4,852,444 | 8/1989 | Hoover et al. | 84/1.05 |
| 4,901,618 | 2/1990 | Blum, Jr. | 84/453 |
| 4,937,874 | 6/1990 | Pittman et al. | 381/61 |
| 4,984,495 | 1/1991 | Fujimori | 84/603 |
| 4,992,751 | 2/1991 | Attwood et al. | 330/10 |
| 4,995,084 | 2/1991 | Pritchard | 379/100 X |
| 5,007,324 | 4/1991 | DeMichele | 84/741 |
| 5,009,146 | 4/1991 | Manabe et al. | 84/627 X |
| 5,009,147 | 4/1991 | Yamamori | 84/618 |
| 5,012,199 | 4/1991 | McKale | 330/51 |
| 5,023,915 | 6/1991 | Brown, Sr. et al. | 381/120 |
| 5,032,796 | 7/1991 | Tiers et al. | 330/110 |
| 5,060,179 | 10/1991 | Sharp | 364/718 |
| 5,074,184 | 12/1991 | Kikumoto | 84/626 |
| 5,074,185 | 12/1991 | Nishikawa | 84/614 |
| 5,086,475 | 2/1992 | Kutaragi et al. | 84/603 X |
| 5,094,138 | 3/1992 | Otsuka et al. | 84/663 |
| 5,097,741 | 3/1992 | Kikumoto | 84/626 |
| 5,119,430 | 6/1992 | Peavey et al. | 381/121 |
| 5,131,044 | 7/1992 | Brown, Sr. et al. | 381/61 |
| 5,133,014 | 7/1992 | Pritchard | 381/61 |
| 5,138,926 | 8/1992 | Stier et al. | 84/615 |
| 5,159,144 | 10/1992 | Fujisawa et al. | 84/656 |
| 5,173,834 | 12/1992 | Sogob | 361/234 |
| 5,197,102 | 3/1993 | Sondermeyer | 381/96 |
| 5,198,603 | 3/1993 | Nishikawa et al. | 84/601 |
| 5,212,676 | 5/1993 | Yamabata et al. | 369/48 |
| 5,262,580 | 11/1993 | Tanaka et al. | 84/602 |
| 5,268,527 | 12/1993 | Waller, Jr. | 84/736 |
| 5,270,475 | 12/1993 | Weiss et al. | 84/603 |
| 5,270,476 | 12/1993 | Rokkaku et al. | 84/609 |
| 5,308,916 | 5/1994 | Murata et al. | 84/603 |
| 5,367,120 | 11/1994 | Hoshiai | 84/654 |
| 5,387,876 | 2/1995 | Sondermeyer | 330/251 |
| 5,393,926 | 2/1995 | Johnson | 84/610 |
| 5,434,536 | 7/1995 | Pritchard | 19/82 |
| 5,486,646 | 1/1996 | Yamashita et al. | 84/635 |
| 5,509,080 | 4/1996 | Roberts | 381/98 |
| 5,524,055 | 6/1996 | Sondermeyer | 381/61 |
| 5,543,579 | 8/1996 | Morinaga et al. | 84/701 |
| 5,578,948 | 11/1996 | Toyama | 84/602 X |
| 5,613,010 | 3/1997 | Heyl et al. | 330/10 X |
| 5,617,058 | 4/1997 | Adrian et al. | 330/10 |

$$f(x) = \begin{cases} -(3/4\ (1-(1-(|x|-0.032847)^{12} + 1/3(|x|-0.032847))+0.01) & x<-0.08905 \\ -6.152x^2 + 3.9375x & -0.08905 \leq x \leq 0.320018 \\ 0.630035 & x>0.320018 \end{cases}$$

TUBE MODELING PROGRAMMABLE DIGITAL GUITAR AMPLIFICATION SYSTEM

FIELD OF INVENTION

The present invention relates generally to audio amplification systems, to audio signal processing, and to guitar amplification systems. More particularly, the present invention concerns a computer controlled digital system designed to achieve a desired sound characteristic associated with a traditional tube-type amplifier.

BACKGROUND

The sound of a guitar playing through a classic combination vacuum tube amplifier and speaker such as the Fender Twin or Marshall Stack has become the standard for most electric guitarists. Unlike other audio amplifiers which simply amplify guitar sounds, these so-called "classic" rock and roll guitar amplifiers are designed to produce very specific, and usually distorted, signature guitar sounds. This quality and amount of distortion in overdriven vacuum-tube guitar amplifiers is found by musicians to be musically pleasing, and responsible for the "warmth" perceived in an amplified musical timbre. This desirable distortion effect of vacuum-tube amplifiers will hereafter be referred to as "tube distortion."

Because an amplifier is perhaps the single most important piece of equipment a guitarist uses to achieve his or her desired tone and given that amplifiers vary widely in tonal character and in quality of distortion, professional guitarists typically require more than one amplifier in order to achieve significantly wide tonal variety. However, having such a multiple amplifier set-up is by no means practical, due to the high cost of professional amplifiers, and due to the need for portable musical equipment. Moreover, few amplifiers contain the means to produce high quality audio effects, such as chorus, delay, and reverberation. These effects processors must be purchased in addition to the amplifiers to achieve tonal variety. Furthermore, in a live performance situation, a guitarist may like to switch among some number of tone settings. Having multiple amplifiers and multiple effects entails having to unplug and plug in some number of audio cables between settings, or adding additional switching circuitry, rendering such systems impractical. Therefore, a need exists for a portable combination of amplifier and speakers that is capable of producing (ie emulates) the tonal behavior of a wide variety of professional amplifiers, thereby eliminating the need for multiple amplifiers.

Most professional guitar amplifiers are based on vacuum-tube designs that have a myriad of disadvantages. While these tube devices have had great commercial success, numerous attempts to emulate tube distortion with analog signal processing devices have been made. Some of the numerous manufacturing disadvantages of tube-based designs including a high cost of supplementary components (e.g. expensive transformers, capacitors, etc. ), as well as manufacturing inconsistencies between tubes. There are also disadvantages to end users of tube amplifiers such as the mechanical sensitivity of tubes, and the need to drive tube amplifiers at high audio output levels to achieve their optimal tonal characteristics.

Numerous non-tube guitar amplifiers are commercially available from companies such as Peavey (Meridian, Miss.) and Crate (St. Louis, Mo.). Furthermore, Laub, in U.S. Pat. No. 3,835,409; Brown, Sr. et al. in U.S. Pat. No. 4,811,401; Pritchard, in U.S. Pat. No. 4,995,084; and Tiers et al. in U.S. Pat. No. 5,032,796 all describe innovative means of achieving tube distortion using analog semiconductor devices. These analog semiconductor embodiments overcome the disadvantages of tube-based designs; however, most are not considered to successfully produce professional-quality tube distortion either because they have substantially no distorting effect or the wrong kind of distortion to produce the desired sound quality. Moreover, an analog semiconductor embodiment does not facilitate programmability nor provide the flexibility of emulating a variety of tube-based design configurations using a single hardware platform.

Prior attempts to digitally produce tube distortion have resulted in products which are of limited utility because they only provide limited tonal modification and further, because they create aliasing artifacts, or "foldover noise," which is a result of high-gain, nonlinear functions in a digital system. For example, in U.S. Pat. No. 4,995,084, Pritchard merely outlines an ideal digital embodiment of tube distortion, entirely ignoring the practical problems of implementation, such as sample rate issues. In addition, there is no mention of foldover noise, or the elimination thereof, in U.S. Pat. No. 4,995,084.

A major component of an amplifier's tone is the frequency response, and quality, of its speakers. The ability to control speaker response must be a major consideration in any attempt to build a device that captures the unique sonic characteristics of classic amplifiers. A major drawback of any stand-alone digital effects processor is its inability to have full control over some important system parameters, including full control over the frequency response of its speakers. One contemporary example of such a product is the GP-100 manufactured and sold by Roland (Japan) which does not allow such control, and hence, its attempt to reproduce classic tones is severely restricted. Furthermore, digital guitar processing products such as Roland's GP-100 also suffer from both limited tonal modification and foldover noise. As these digital guitar signal processing products are intended for use by professional guitar musicians, they represent the state of the art, indicating that the solution to the problem of foldover noise is by no means simple or obvious.

In sum, both solid-state and digital instrument amplifiers have always carried with them the criticism that each cannot achieve the rich, warm sound characteristics commonly associated with the tube sound of a classic Fender Twin or Marshall Stack amplifier, and speaker cabinet.

SUMMARY OF THE INVENTION

It is an object of this invention to provide a portable combination of amplifier and speakers that produces the tonal behavior of (i.e. emulates) a wide variety of professional amplifiers, thereby eliminating the need for multiple tube-type amplifiers. The method by which the present invention recreates tube distortion without foldover noise, and emulates a variety of amplifier types, is to provide full control of all system parameters, including full control over the frequency response of the speakers. This method of accurately reproducing a wide variety of tones will be referred to as TubeTone™ modeling.

A further object of this invention is to provide realistic tube distortion at any volume level. A tube amplifier generally requires a high output level to achieve a warm-sounding distortion. The effects of an overdriven vacuum tube are created via TubeTone™ modeling, and the resulting signal retains its overdriven characteristics at arbitrarily low levels.

It is a further object of this invention to provide all the functionality of a professional guitar amplifier. The preamp-type functions included in the present invention are: bright switch (a highpass filter control for timbral "brightness"); a presence control; tone controls (filters for adjusting bass, midrange, and treble frequency bands); mono and stereo tremolo (a modulation of amplitude); drive controls (which increase or decrease the amount of distortion); and graphic equalization (a bank of bandpass filters, evenly spaced in frequency).

It is still a further object of this invention to include the functionality of auxiliary analog equipment to change the timbre of a guitar prior to signal amplification. Preferably, effects of said equipment include "wah wah" effects (a bandpass filter that is manually or automatically swept in frequency, amplitude, and bandwidth); a remote pedal volume control; an autovolume effect (an amplitude envelope that triggers upon a newly played note); a selection of pre-preamp distortion effects (this is also called "fuzz"); a phase shifter (a bank of allpass filters); dynamic range compression; a hum canceller; and a noise gate. Digital versions of such analog-style effects are realized by the digital signal processor.

It is a still further object of this invention to provide features not typically offered by guitar amplifiers. These features include a "stereo spread" effect which gives the illusion that the speakers are spaced farther apart. The present invention also includes a built-in guitar tuner, and an auxiliary input channel to amplify any audio input (e.g. an accompaniment instrument). Preferably, auxiliary channel has independent equalization and reverberation controls.

It is still a further object of this invention to provide professional-quality digital effects which can be used to provide sonically interesting effects to a guitar signal. These linear effects include stereo rotary speaker effects; mono and stereo chorusing and flanging (the output of a variable-length delay line is summed with its input signal); reverberation (the present invention includes both a physically-modeled spring reverb, and a smooth, long-decaying studio reverb); and a variety of delay effects (mono, stereo, ping pong, multitap, dynamic, and tap-tempo types).

It is still a further object of this invention to provide full programmability, and the ability to store programs in memory. Programmability allows the user to create many distinct tonal configurations. These configurations, called "programs," can be stored in memory, and later recalled at the press of a button.

It is a further object of this invention to provide the means for this device to be used in conjunction with existing signal-processing equipment. Often, guitar amplifiers and other audio equipment (mixing boards, for instance) provide "effects send" and "effects return" jacks to allow internal audio signals to be processed by external equipment. These external devices can be any audio-processing devices such as effects, filters, or monitoring devices. In conventional terminology, this external signal path is called an "effects loop," and allows the use of external equipment.

It is still a further object of the invention to provide a musical instrument digital interface (also known as "MIDI"), which allows the amplifier to communicate with a variety of other instruments and controllers, including MIDI foot pedal controllers, and computer equipment. MIDI allows the guitar amplifier to be controlled by external equipment, and allows the saving of programs on external memory devices.

BRIEF DESCRIPTION OF DRAWINGS

The foregoing and other objects, features, and advantages of the invention will become more readily apparent upon reference to the following detailed description of a presently preferred embodiment, when taken in conjunction with the accompanying drawings in which like numbers refer to like parts, and in which.

DETAILED DESCRIPTION OF THE INVENTION

Figure 27:
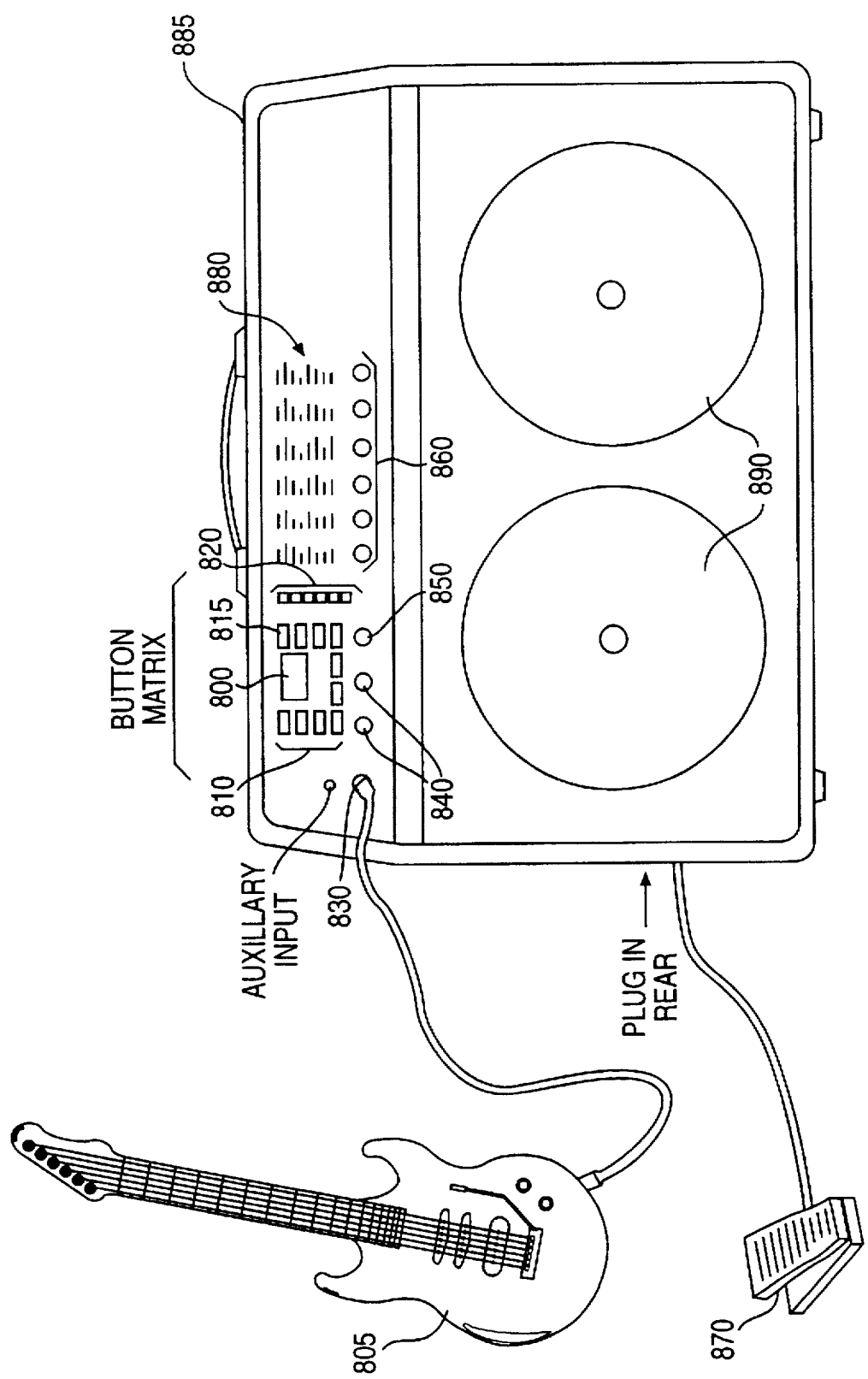
FIG. 27 shows the present invention fully assembled.

Referring to FIG. 27, a picture of the present invention, fully assembled, is shown. The front panel of the invention has three-digit user display 800 to indicate the current program bank (user bank or preset bank), the current program number (1-32), and the current program sound (A, B, C, or D). Program selection and program storage are performed with program select buttons 810 and programing buttons 820. Electric guitar's 805 output is plugged into guitar input jack 830, and the input level is set with the 'guitar' level control knob 840. The overall level of the amplifier is set using 'master' knob 850. Control knobs 860 are provided for drive, bass, mid, treble, gain, and delay/ reverb level respectively. Standard (preexisting) foot pedal 870 may be used for additional control. These pedals may be of the voltage controlling variety, or MIDI pedals. To program the invention, one of programming buttons 820 is pressed, giving the user access to the row of functions written in function matrix 880. When a programming button 820 is pressed, control knobs 860 serve as data entry devices. The preferred embodiment is housed in unit 885 which contains two twelve-inch loudspeakers 890, and provides excellent sound quality, loudness, and portability. A user's manual detailing the operation of the present invention and product brochure detailing the physical features of the present invention are attached hereto as Technical Appendix A and incorporated by reference herein.

Figure 1:
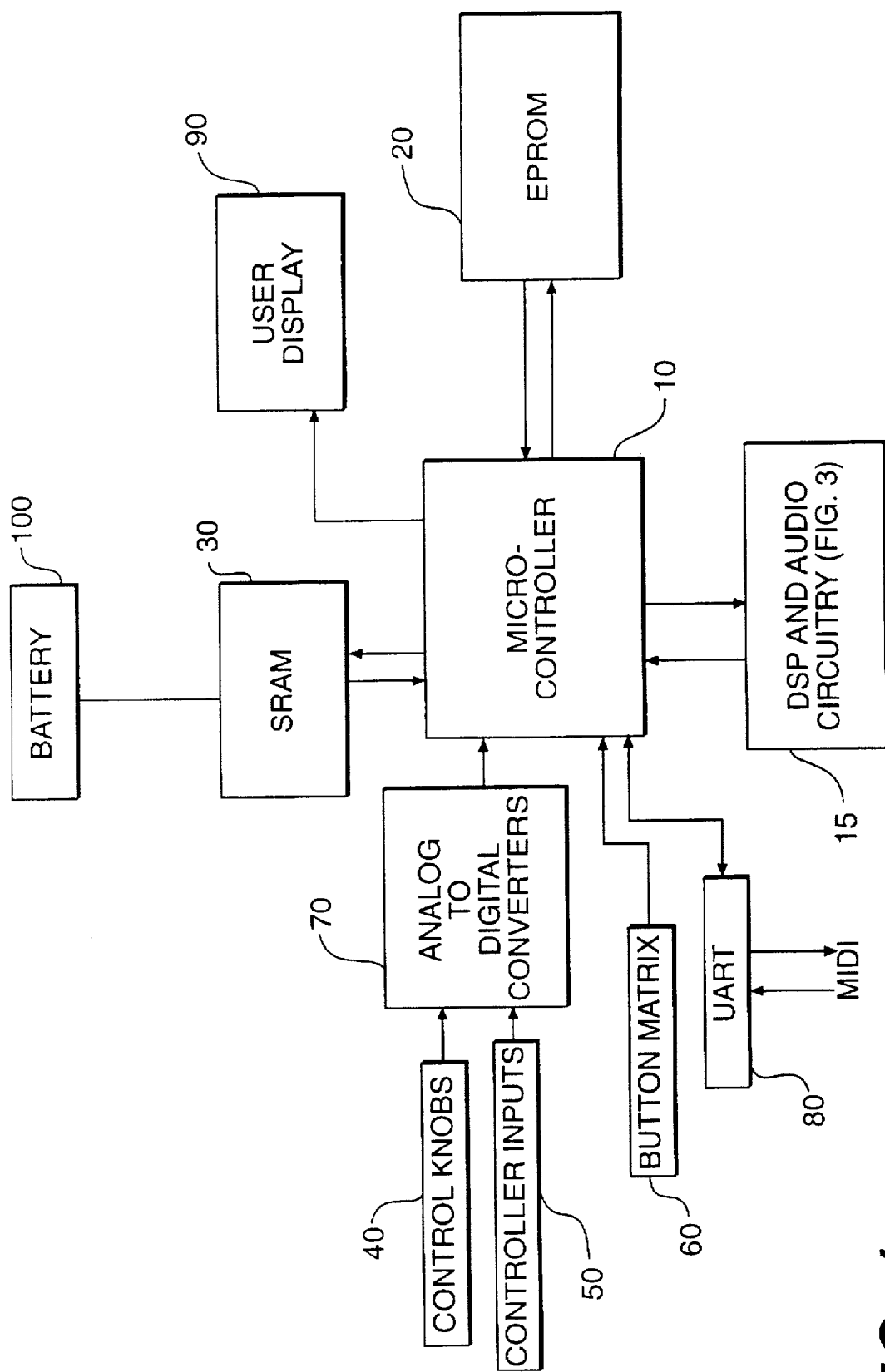
FIG. 1 is a system block diagram.

Referring now to FIG. 1, an overall block diagram of the system embodying the present invention is shown. At the heart of the controller side is microcontroller 10. Microcontroller 10 can be any off-the-shelf device with a standard Von Neumman architecture, receiving its program code from EPROM 20. Microcontroller 10 uses SRAM 30 (static RAM), which is powered by battery 100, as a scratch pad for calculations and as a storage device for programs. It polls a matrix of front-panel switches 60, and A/D converters 70 which input data from controller inputs 50 and from front-panel potentiometers 40 (knobs). MIDI data is sent to and from microcontroller 10 via universal asynchronous receiver and transmitter (UART) 80. Microcontroller 10 sends data to user display 90. Microcontroller 10 interfaces with digital signal processing (DSP) circuit 15 (shown in greater detail in FIG. 3) to download DSP programs, send coefficient changes, send program change information, and receive information about the audio signal (e.g. tuning information).

Figure 2:
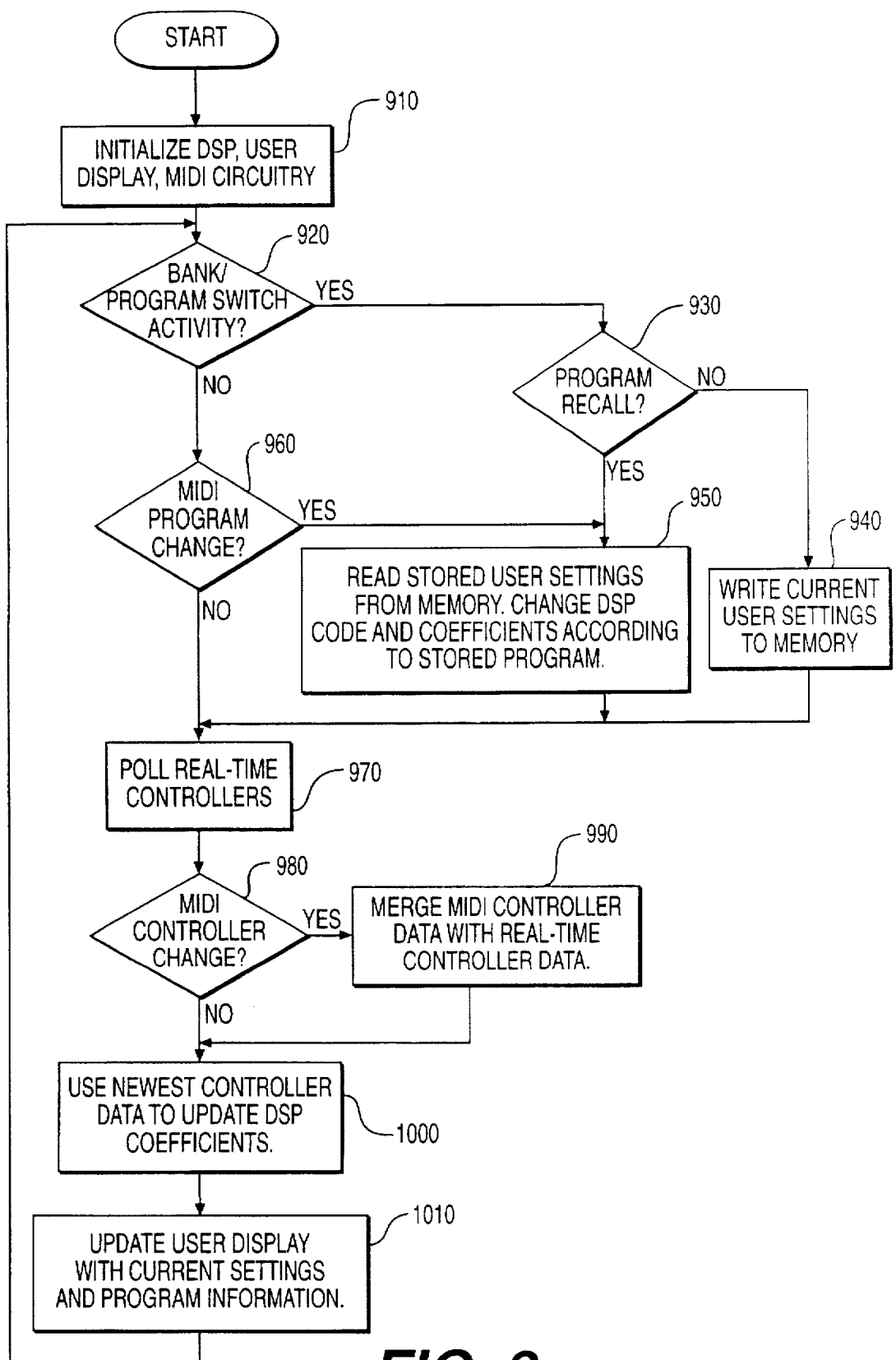
FIG. 2 is a flowchart of microcontroller activity.

FIG. 2 shows the control flowchart of the microcontroller. Its activities include polling switches to determine if any of the user parameters have changed, and it performs all actions based on these changes. The microcontroller also handles MIDI information, and computes the coefficients and control information for all of the DSP functions. On power-up, the microcontroller initializes the DSP, the user display, and the MIDI circuitry (the UART), as shown in block 910. Once the entire system is initialized, the controller executes instructions in an infinite loop.

Beginning this loop of instructions is a test to determine if one of the program-related buttons has been pushed as shown in decision block 920. If a button has been pushed, indicated in decision block 930, a user is either recalling a program from memory, as shown in block 950, or is saving the current program to memory, as shown in block 940. In either case, the microcontroller responds accordingly, reading from or writing to memory, as shown in blocks 950 or 940 respectively. If the current program is changed, the DSP code may change, and the DSP coefficients (for filters and other effects) may need to change according to the newly recalled program, as shown in block 950. If a button has not been pushed and if a MIDI program change message is received, as shown in decision block 960, a program will be recalled from memory, as shown in block 950. Next, real-time controllers are examined by the microcontroller in decision block 970. Real-time controllers are those controls (such as front panel knobs) which allow the user to make changes in the tone without recalling a full program from memory. Examples of such controllers are effects level controls, external foot pedal controls, tone controls, LFO speed controls, etc. MIDI controllers are checked next. Typically, MIDI controllers perform the functions of real-time controllers, but are treated separately, as the data are distinctly different from the data generated by the real-time controllers mentioned above.

When MIDI controller information is received by the microcontroller, it is merged with the other real-time controller information to determine the appropriate response of the system to the incoming user information, as shown in block 990. This set of new controller information is used by the microcontroller to send program and coefficient information to the DSP, as shown in block 1000. For example, if the user turns the "treble" knob clockwise, the microcontroller senses this, and sends the DSP an updated value for a highpass filter coefficient. Lastly, the user display is updated with the latest information, as shown in block 1010. This displayed information indicates to the user the current program number, and any editing information. Once the system has been updated with the current controller information, then the user display has been updated. The system loops back to decision block 920.

Figure 3:
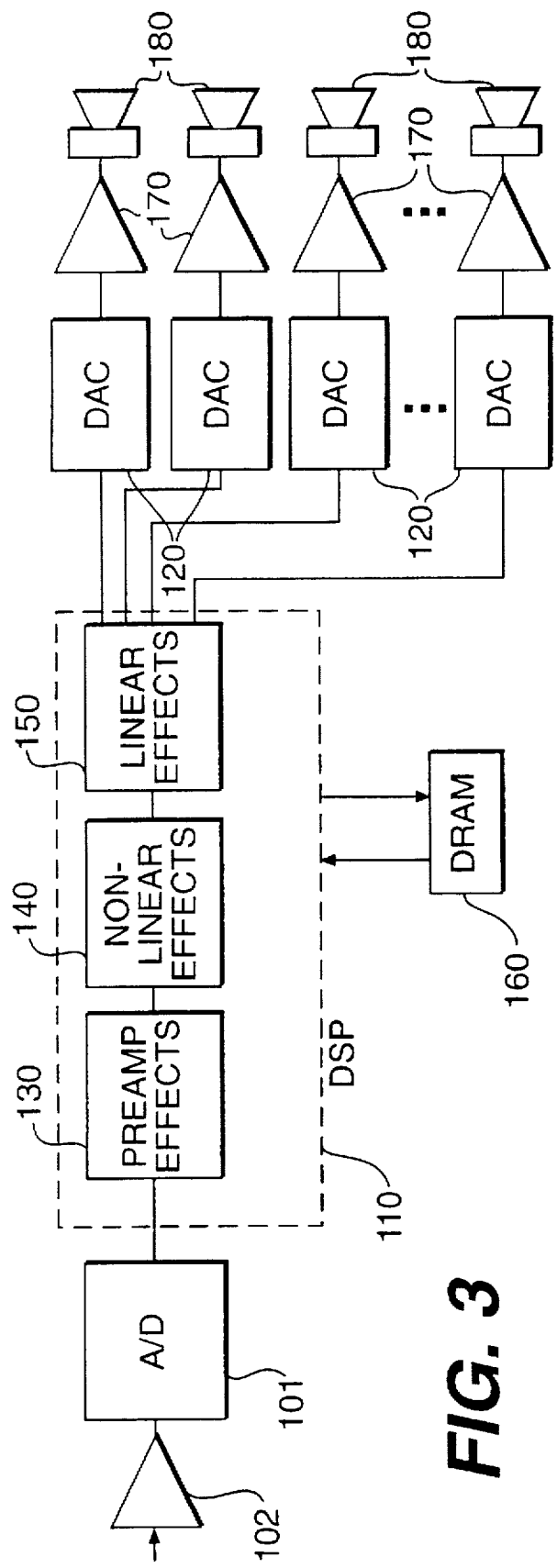
FIG. 3 is an overview of the audio signal flow.

Referring to FIG. 3, an overview of the audio signal flow in the present invention is shown. An input guitar signal needs to be set at the appropriate level for input to the analog to digital converter. In general, the input signal requires amplification, from amplifier 102, to maximally modulate A/D converter 101 without causing the A/D 101 to clip. A/D converter 101 must be of sufficient resolution to accurately convert the wide dynamic range of the guitar signal. The output of the A/D is sent in digital form to digital signal processor (DSP) block 110, which processes the signal and sends it to one or more digital to analog converters 120 (DAC). The intermediate stages of DSP processing block 110 are comprised of preamp effects section 130, nonlinear effects section 140; and linear effects section 150. The sampling rate in converting the analog to a digital signal is critical, and has the most impact upon the cost efficiency of the design. Any standard professional audio sample rate can be used (typically 32 kHz, 44.1 kHz, or 48 kHz), and two or more such DSP devices may be used in conjunction to provide greater processing capability. In the preferred embodiment, a sampling rate of 31.2 kHz. Preferably, for effects requiring a significant amount of delay, some external dynamic random access memory 160 (DRAM) is most likely required. The present invention utilizes 64K words (at 16 bits/word) or 1024 kbits of DRAM.

In a programmable system, such as the present invention, the digital signal processing is operated under the control of a microprocessor. DSP processing block 110 sends one or more outputs to one or more DACs 120, which convert the multichannel digital signal to multiple analog signals, which are then in turn input to amplifiers 170. The specifications of the amplifier devices determine the overall power of the system, which in the preferred embodiment, is 50 Watts per channel (RMS). In the present invention, each amplifier 170 drives individual speakers 180.

Figure 4:
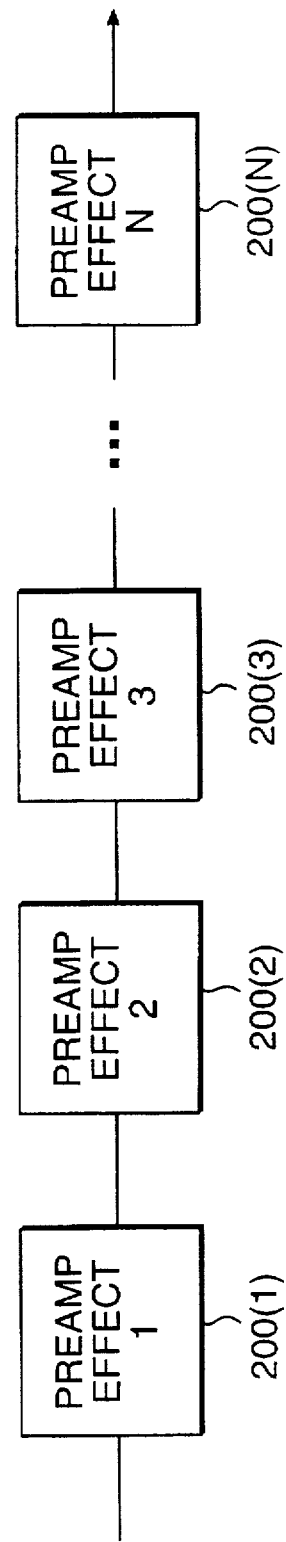
FIG. 4 is a more detailed block diagram of the preamp effects section from FIG. 3 with N different effects.

Preamp effects section 130 of FIG. 1 is shown in more detail in FIG. 4 which illustrates the digital implementation of a variety of "analog-style" effects that a typical guitar player might use to alter the tonality of his or her guitar prior to amplification. As shown in FIG. 4, N number of these effects may be connected in series, forming a chain of N preamp effects, as illustrated by preamp effects 200(1), 200(2), 200(3) . . . 200(N). It is also possible to obtain greater tonal variation by changing the order of preamp effects 200(1), 200(2), 200(3) . . . 200(N).

Figure 5:
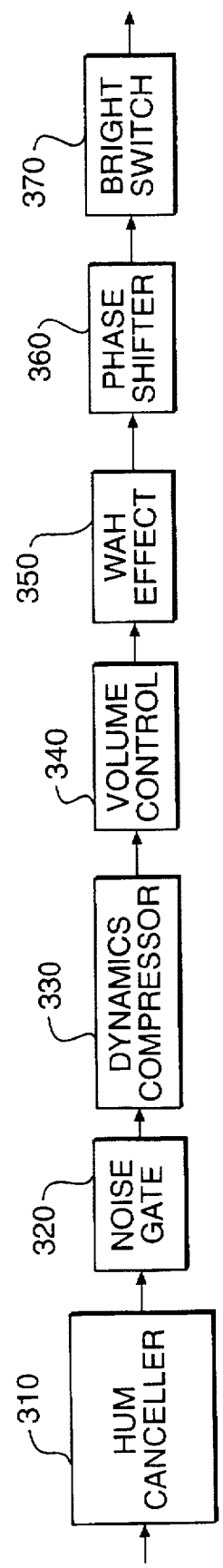
FIG. 5 shows the preferred preamp effects section from FIGS. 3–4 with a chain of 7 preamp effects.

Referring to FIG. 5, a preferred embodiment illustrating a preamp effects section having a chain of seven preamp effects 200 (N=7) includes the following effects:

1) Hum canceller 310 is used to eliminate 50 Hz or 60 Hz hum due to AC power line noise. Hum canceller 310 is essentially a comb filter that cancels the fundamental frequency and all harmonic frequencies of the AC power line noise (50 Hz or 60 Hz). Construction of comb filters is well known by those skilled in the art, and consists of a delayed signal subtracted from the input to the delay. The length of the delay determines which frequencies are canceled. The microprocessor detects the frequency of the AC line supply voltage to determine for the DSP which delay length to use.

2) Noise gate 320 is an attenuator which fully attenuates an input signal if its level is below a user-controlled threshold, and has no attenuation if said signal level is above the threshold.

3) Dynamic compressor 330 is an amplifier which decreases its gain proportionally as the level of the input increases.

4) Volume control 340 is an attenuator, most often controlled with an external foot pedal. Here, the microprocessor determines the position of a foot pedal (or other controller), and computes a proportional multiplier coefficient, between 0 and 1, to control the DSP-based attenuator.

5) "Wah" effect 350 is a sweepable bandpass filter, controlled either externally or automatically. Similar to the volume control above, the microprocessor may send a coefficient to the DSP, where the appropriate coefficients for a resonant bandpass filter are calculated. Under automatic control, the DSP controls the sweeping behavior of the filter. This user-selectable sweeping behavior is based on input signal dynamics, a low frequency oscillator (LFO), or a pseudo-random number (PRN) generator.

Preferably, the bandpass filter used in the present invention is detailed in Dattorro, Jon, "The Implementation of Recursive Digital Filters for High-Fidelity Audio," Journal of the Audio Engineering Society, 36:11 (1988) (hereinafter "Dattorro article"). This article, as well as every other reference mentioned, is expressly incorporated by reference herein. The preferred method of constructing the LFO is to increase the Q of a bandpass filter to the point of oscillation, where the parameters normally controlling the center frequency can be used to set the oscillator's frequency. Finally, the preferred method of generating pseudorandom noise is to use a variety of well known trigonometric formulas such as the ones found in Proakis and Manolakis, *Digital Signal Processing* (Prentice-Hall, 1996) at B6, incorporated by reference herein.

Figure 26:
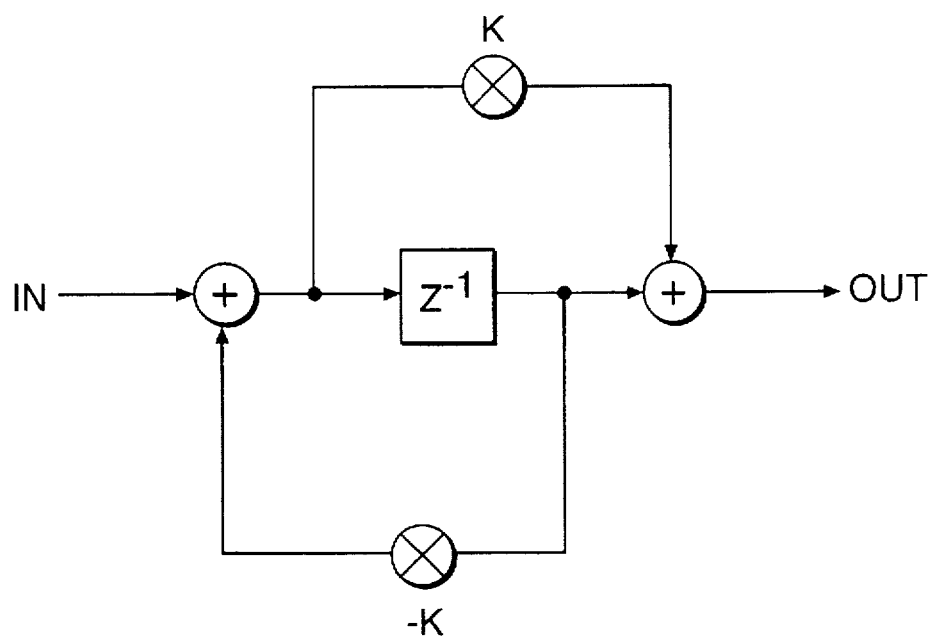
FIG. 26 is the dsp flow diagram of an allpass filter.

6) Phase shifter 360 is a bank of allpass filters whose center frequencies are swept by a common LFO. An allpass filter is a filter which changes only the phase of a signal, and not its amplitude or frequency response. A highly useful discussion is given in Oppenheim and Schafer, *Discrete-time Signal Processing* (Prentice-Hall, 1989) at 234–240, incorporated by reference herein. The basic allpass filter is shown in FIG. 26, and its behavior is detailed in Moorer, James A., "About This Reverberation Business," Computer Music Journal, 3:2 (1979), incorporated by reference herein. Preferably, the allpass filter of FIG. 26 utilizes a single parameter, K, which sets the frequency at which the phase of the output signal differs 90 degrees from the input signal, also called the "center frequency" of the allpass. See Regallia, Mitra, and Vaidyanathan, "The Digital All-Pass Filter: A Versatile Signal Processing Building Block," IEEE Proceedings, 76:1 (1988), incorporated by reference herein.

7) Bright switch 370 is a highpass filter to control the timbral "brightness" of a guitarist's tone. This is an important effect, especially for rock and roll music, where a guitarist may wish to play high notes loudly during a solo. The basic building block of many of the filters in the present invention is the one-pole lowpass filter of FIG. 20. The cutoff frequency $F_c$ is the point at which the input signal is attenuated by 3 dB from unity gain. FIG. 21 shows the gain of the filter as a function of frequency, showing unity gain for low frequencies, and full attenuation for high frequencies. K is the single coefficient of this filter, and determines the cutoff frequency $F_c$ of the filter according to the formula $$k = e^{\frac{-2\pi F_c}{F_s}}.$$

Figure 20:
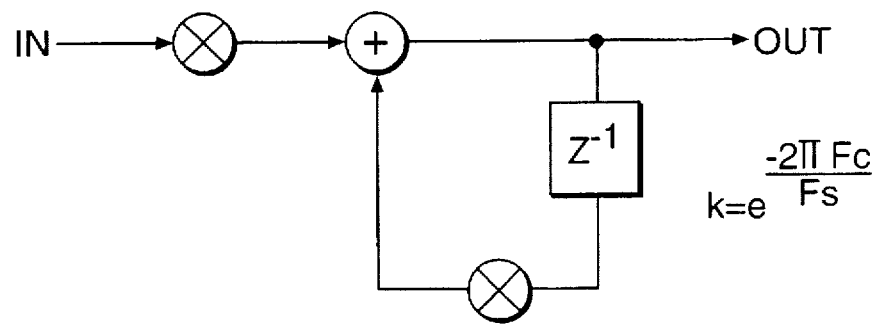
FIG. 20 is a DSP flow diagram of a one-pole lowpass filter.
Figure 21:
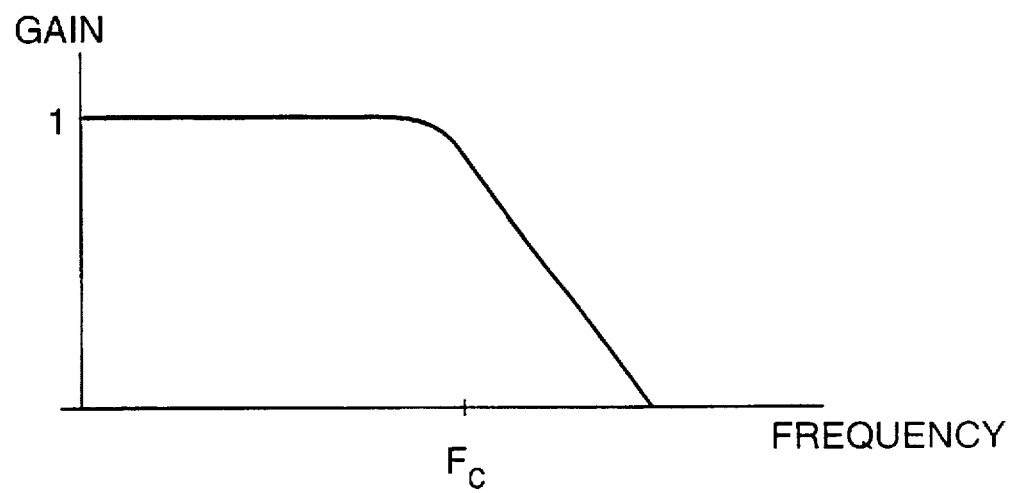
FIG. 21 is the frequency response of the lowpass filter shown in FIG. 20.
Figure 22:
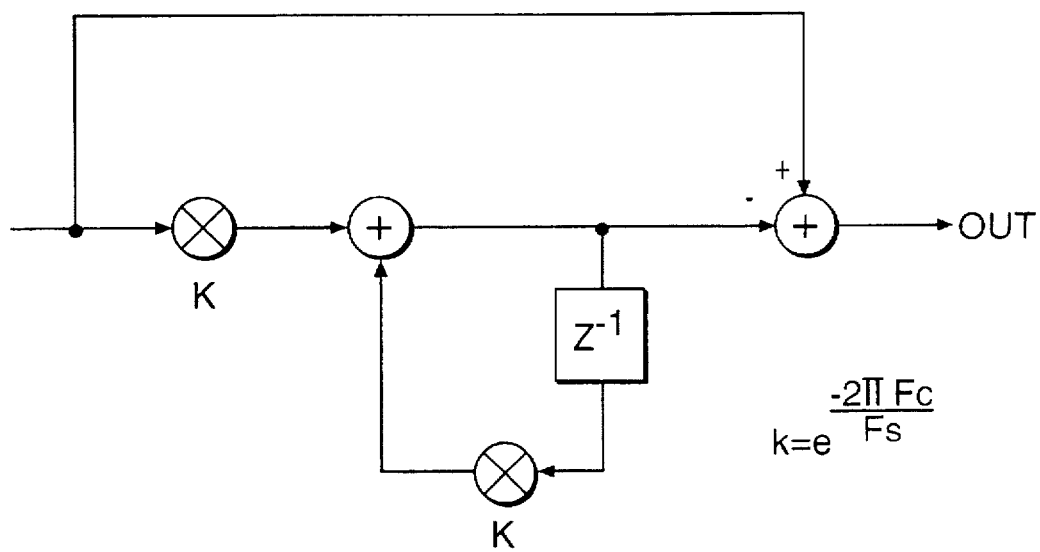
FIG. 22 is the DSP flow diagram of a one-pole highpass filter.
Figure 23:
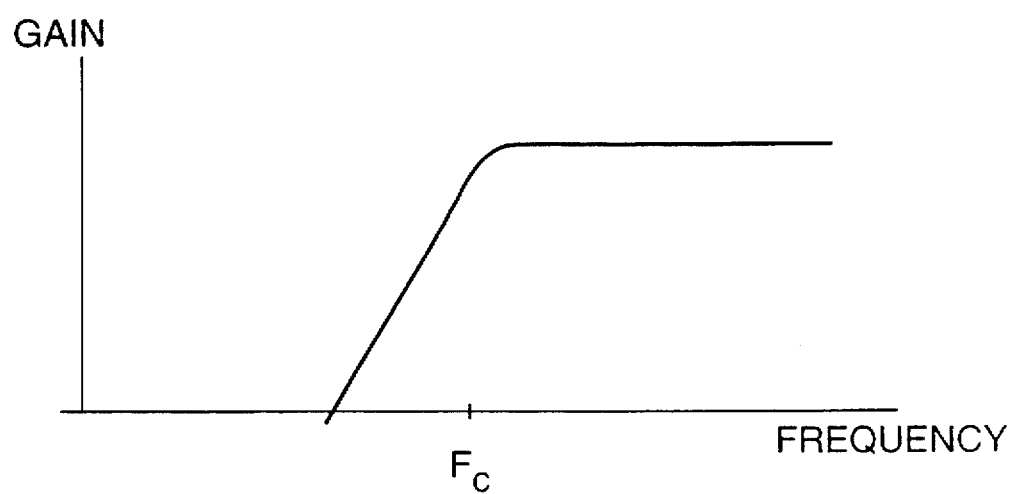
FIG. 23 is the frequency response of the highpass filter shown in FIG. 22.

Through a simple subtraction of the lowpass filter's output from its input, we simply transform the lowpass filter of FIG. 20 into a one-pole highpass filter, shown in FIG. 22 with its associated frequency response in FIG. 23. K, the filter coefficient that determines the cutoff frequency, is calculated the same way as in the one-pole lowpass. An article explaining some of the principles behind these particular filters is Hirata, Yoshimutsu, "Digitalization of Conventional Analog Filters for Recording Use," Journal of the Audio Engineering Society, 29:5 (1991), incorporated by reference herein.

Figure 6:
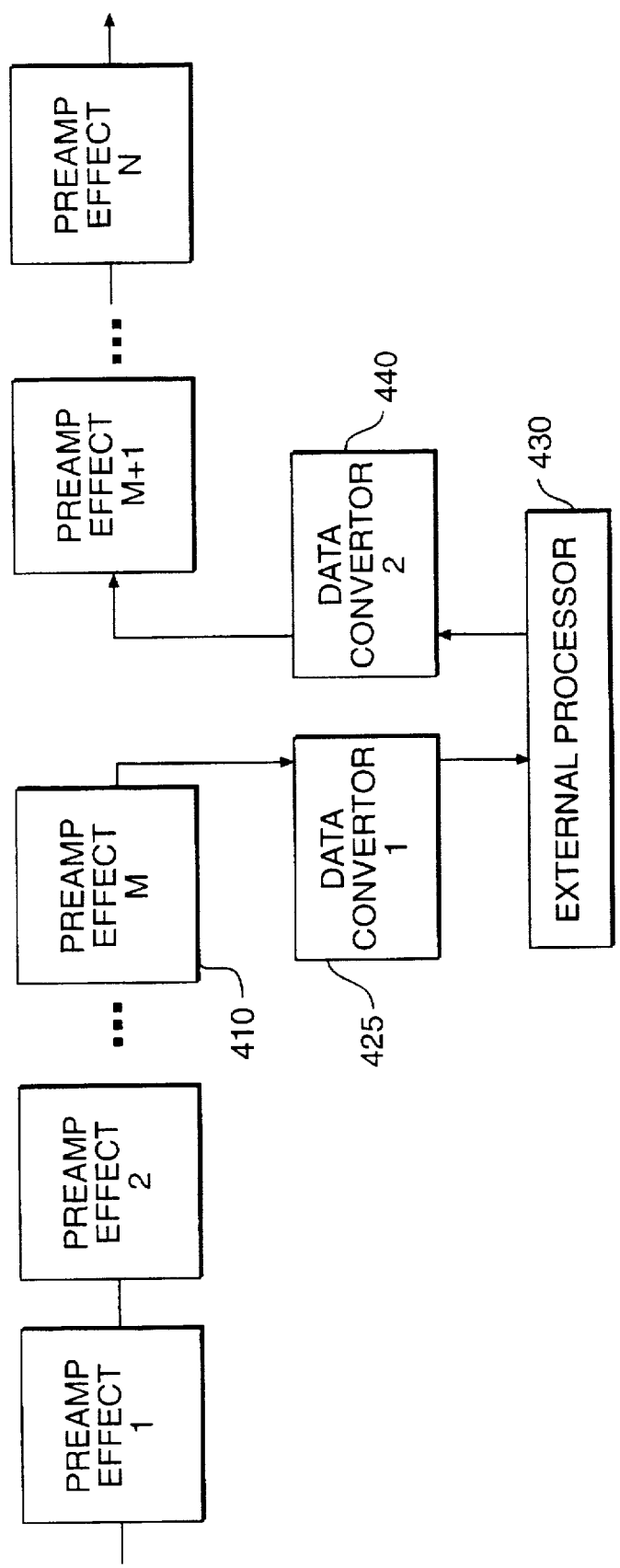
FIG. 6 is a view of a preamp effects section with a chain of N different effects, having an external effects loop after the Mth effect in the chain.

A chain of N preamp effects may include an effects loop to send data to, and receive data from, external equipment as shown in FIG. 6. An "effects loop" is an input/output pair of connections, and some external chain of signal processing devices which process the audio signal. Effects loops are almost always found on audio mixers, whereby an audio signal is sent out an "effects send" jack, processed externally, and returned to the mixer via an "effects return" jack. Some examples of external processing effects that may be used by guitarists are "univibe" vibrato effects, pitch-shifting effects, etc. Effects such as those internal to the present invention are possibilities as well. After the first M effects in the chain (where M≦N), the output of preamp effect 410 number M is sent to an appropriate data converter 420 whose output is sent to external processor 430. Data converter 420 may convert data from digital to analog (DAC), or may merely alter the format of the digital data to a form that is readable by an external processor. Examples of some standard digital formats are S/PDIF, and AES/EBU. External processing 430 has an output which is sent to an appropriate data converter 440 whose output is sent to the DSP. Data converter 440 may convert from analog to digital (A/D), or may merely alter the format of the digital data to a form that is readable by the DSP. Once in the DSP again, the signal is routed through the remaining N-M effects in the chain. A preferred embodiment for the effects loop uses a high quality digital to analog converter to provide a signal compatible to external processing equipment. The most widely used preexisting equipment typically requires an analog signal as input. The preferred embodiment also features a high quality analog to digital converter to read the analog output of said external equipment into the DSP for further processing in the chain.

All of the above "analog-style" preamplifier effects are widely known to one skilled in the audio engineering discipline, and their transformation from the well-known analog circuitry to digital algorithms is straightforward for a competent digital signal processing engineer to implement. It should be noted that there is no reason why one or more of these effects cannot follow the tube distortion portion of the amplifier. They are considered as a group here only by way of example, and to follow stylistic convention.

Figure 8:
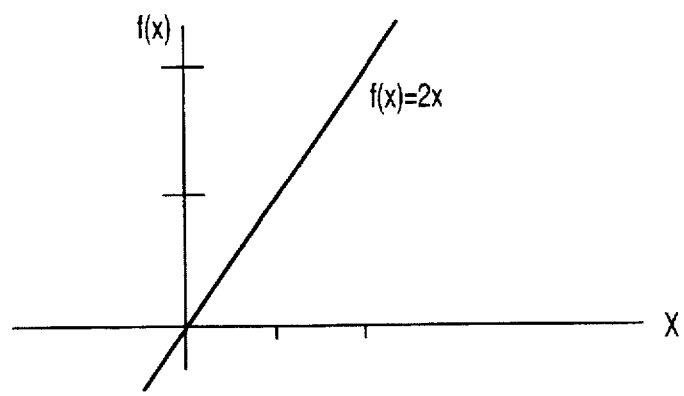
FIG. 8 is a graph of the linear function $f(x)=2x$.
Figure 9:
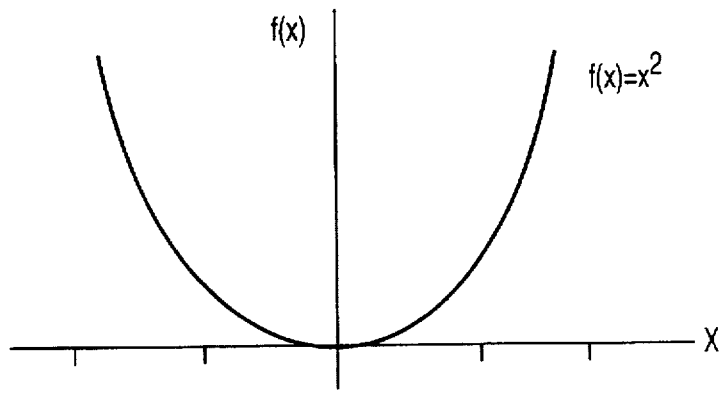
FIG. 9 is a graph of the nonlinear function $f(x)=x^2$.

Nonlinear effects section 140 from FIG. 3 can be explained in more detail with reference to FIGS. 7–9. Nonlinear effects section 140 utilizes nonlinear transfer functions, which are functions which do not obey the mathematical principle of superposition, i.e., for a function f, for input sequences $x1|n|$ and $x2|n|$, where n is the number of a sample in a discrete-time system, and for arbitrary constants A and B, f is linear if and only if $f(A*x1|n|+B*x2|n|)=A*f(x1|n|)+B*f(x2|n|)$. As is the case with most distortion-producing functions, functions which produce high-gain tube distortion are nonlinear. An example of the linear function $f(x)=2x$ is shown in FIG. 8, and an example of a nonlinear function $f(x)=x^2$ is shown in FIG. 9.

In every real digital system, there is some frequency, $F_s$ samples per second, at which the analog input is sampled and processed. When an analog signal is sampled at a rate of $F_s$ samples per second, typically by the A/D converter, it is sent first through an anti-aliasing filter which removes any high frequency content above $F_s/2$. If a signal of frequency f, such that f is greater than $F_s/2$, is sampled without an anti-aliasing filter, the resulting digital representation will not be at the original frequency f, but rather at an alias of that frequency in the range $0 \leq f \leq F_s/2$. If $F_s/2 < f < F_s$, the system will have a representation for a signal at frequency $(F_s/2-f)$. This is called "aliasing," or "foldover." Currently, professional, state of the art, digital audio signal processing uses sampling frequencies of 32 kHz, 44.1 kHz, and 48 kHz. A fundamental limitation of digital signal processing, which is well known, is that the highest frequency that a digital system can produce is $F_s/2$.

Sampling, however, is not the only way for foldover to occur. Nonlinear functions can produce high-frequency harmonics with significant amplitude. The emulation of tube distortion is one such function. Aforementioned examples of digital implementations of tube distortion suffer from this foldover noise, and are of limited usefulness. If foldover noise is not dealt with, each high note will cause the amplifier to output nonharmonic frequencies. Foldover noise is especially noticeable if the input frequency is swept, for example, when a guitar note bends up or down in pitch. In this case, the foldover artifacts sweep in frequencies which are nonharmonically related to the pitch of the guitar note, and they typically sweep in the opposite direction of the guitar note sweeping.

Once this problem of foldover noise is detected, it is apparent that, in principle, a digital system could be constructed which has a sufficiently high sampling frequency that will not suffer appreciably from foldover noise. Given the current state of the art, it is prohibitively expensive to build a commercially viable system whose sampling frequency is high enough to avoid the creation of foldover artifacts in a tube modeling system, such as that of the present invention. The harmonics generated by tube distortion are very high in frequency relative to the sample rate, and the aliases of these signals are easily audible without treatment.

It is possible, however, to use an oversampling technique to drastically increase the sampling rate for specific functions, from $F_s$ to an integer multiple of $F_s$, and keep the rest of the system running at its "normal" speed, $F_s$. Without limiting the invention, this is one basis for the present invention, which is able to efficiently compute a full complement of audio effect algorithms in addition to emulating tube distortion without foldover noise.

Figure 7:
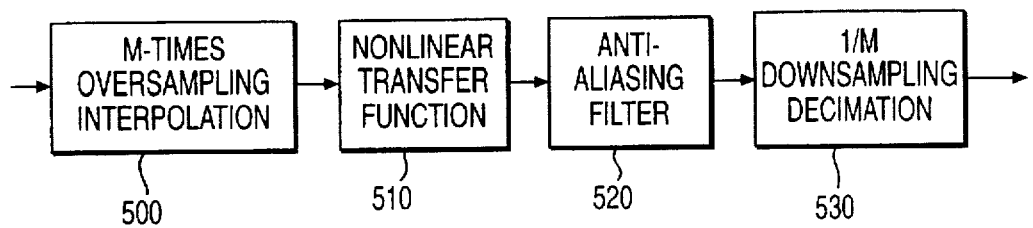
FIG. 7 is a block diagram of non-linear effects section of FIG. 3.
Figure 10:
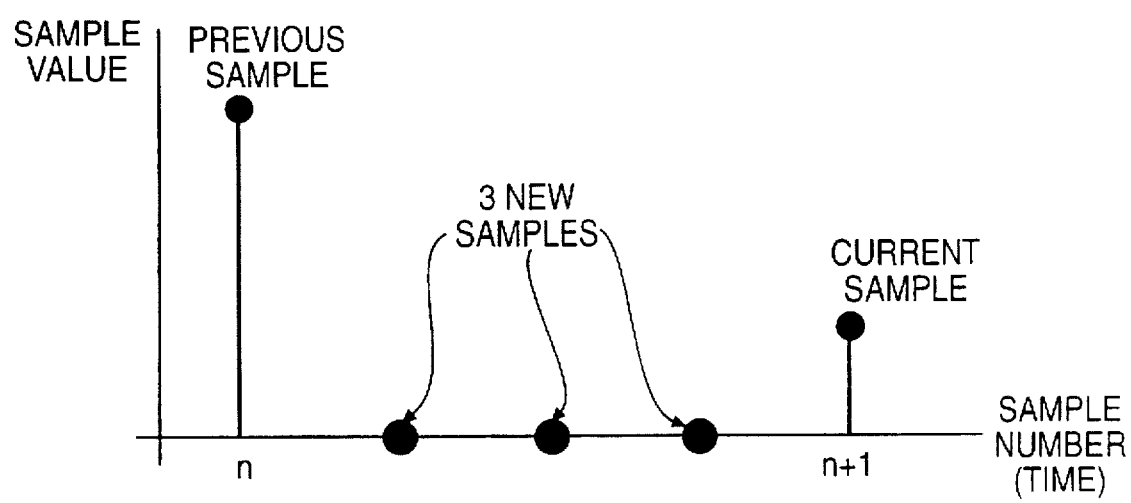
FIG. 10 shows a zero-insertion interpolation, shown for 4 times oversampling.
Figure 11:
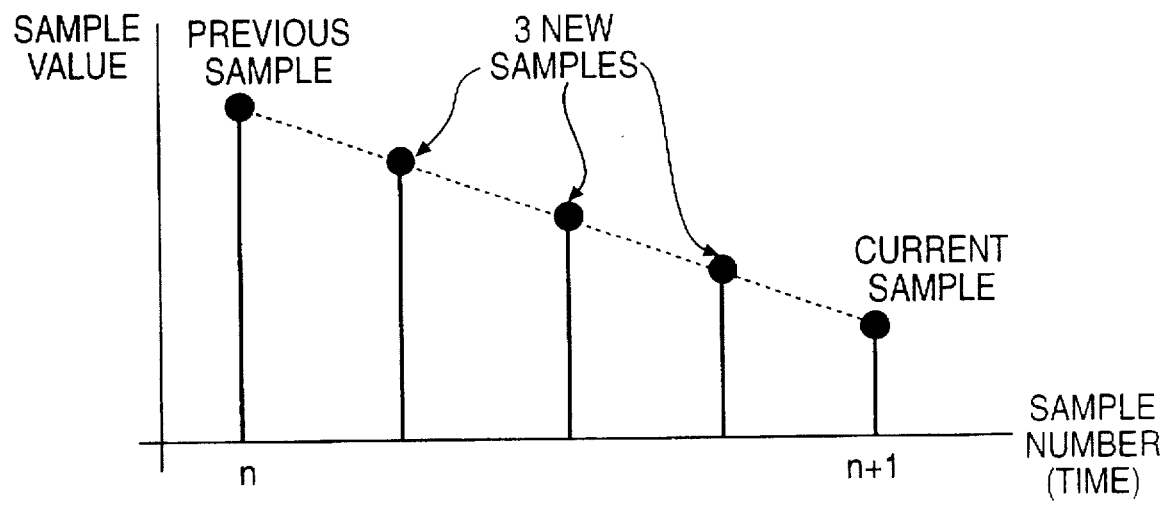
FIG. 11 shows a linear interpolation, shown for 4 times oversampling.
Figure 12:
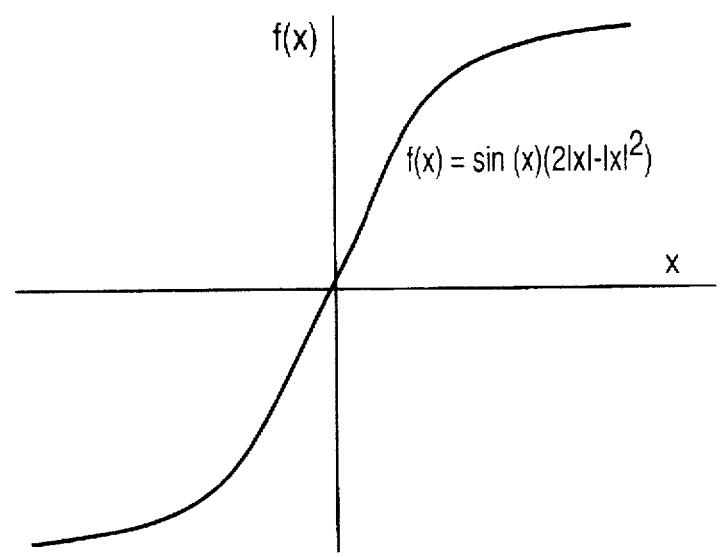
FIG. 12 shows an example of a nonlinear transfer function.

Referring to FIG. 7, the basic scheme of the nonlinear effects section is shown. The input signal is oversampled at M-times the original rate in oversampling and interpolation block 500, thereby creating M-1 samples for each original sample. Various techniques can be used in the interpolation step. One technique is a zero-insertion method, which inserts M-1 zeros between each original sample followed by a lowpass filter. This zero-insertion method is shown in FIG. 10. Preferably, linear interpolation is used with M=8 in its oversampling bringing the effective sampling rate to 8 times 31.2 kHz, or 249.6 kHz. Linear interpolation, which is illustrated in FIG. 11, inserts M-1 samples that lie on the line between the current sample and the previous sample. Therefore, the present invention inserts 7 additional samples between the current sample and the previous sample.

Nonlinear transfer function block 510 can contain any number of basic functions which may or may not be linear functions. Keeping in mind that each of these functions is to be computed M times for an M-times oversampling scheme, it behooves one to optimize the performance of these functions, as they utilize a proportionally greater amount of system resources. These functions can replicate the transfer function of any variety of tube types; the transfer function of "fuzz" distortion effects; as well as the transfer functions of hard-clipping.

Preferably, there are three nonlinear transfer function used in the present invention.

1) The first is $$f(x)=(|2x|-x^2)\sin(x)$$

where $\sin(x)=1$ if $x>0$ and $\sin(x)=-1$ otherwise. This transfer function closely tracks the effects of a tube amplifier. In other words, it behaves similarly to the transfer function of a tube amplifier.

2) A second transfer function which emulates hard clipping, and is used to model "fuzz" effects, giving a harsh distortion. The hard clipping transfer function is $$f(x) \begin{cases} Kx & \text{if } |x| < \text{MaxValue} \\ \sin(x) \cdot K \cdot \text{MaxValue} & \text{otherwise} \end{cases}$$

Figure 13:
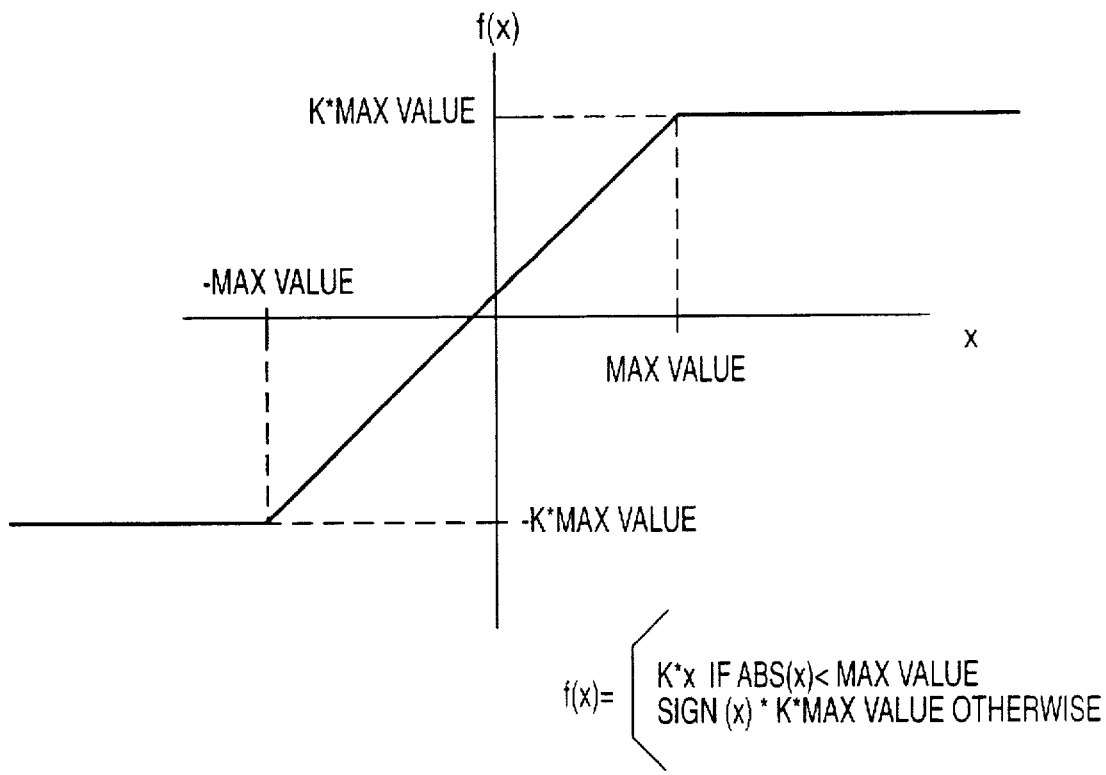
FIG. 13 is a graph of a hard-clipping transfer function

This hard clipping transfer function is shown in FIG. 13.

Figure 14:
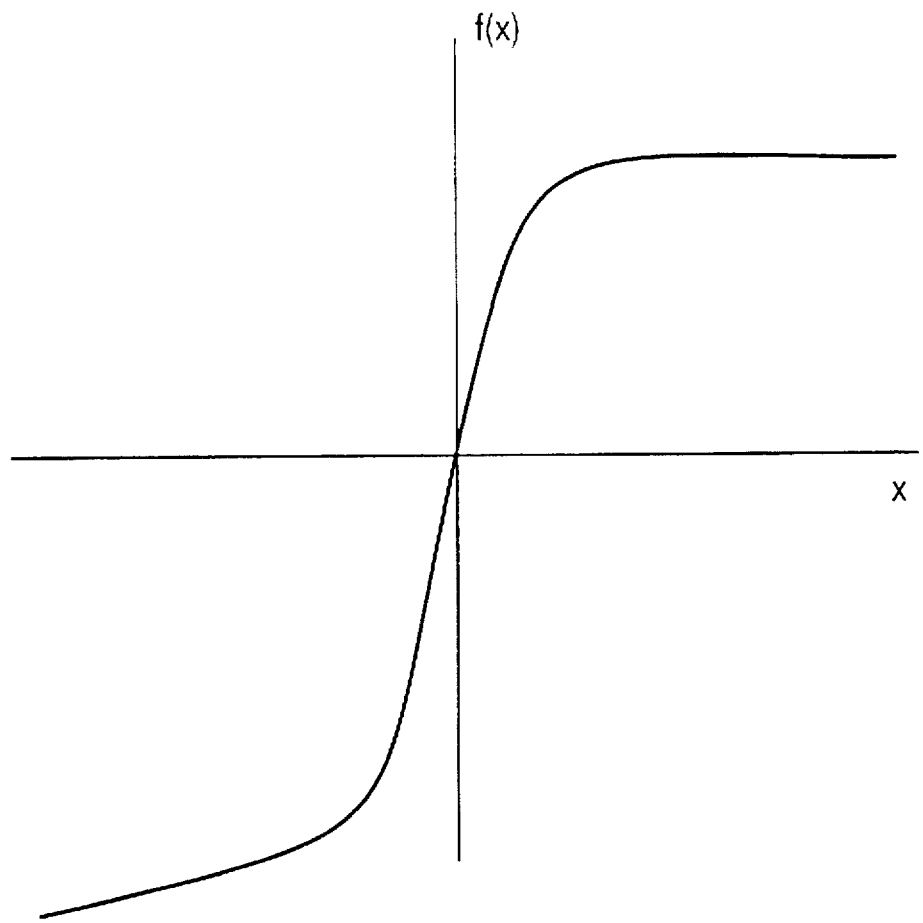
FIG. 14 is a graph of a tube-simulating nonlinear transfer function.

3) A third transfer function which is used to model several tube preamps is a piecewise function shown in FIG. 14. There are three distinct regions making up the curve, over the domain $-1<=x<=1$. In the first region of this function $$f(x) = -\left[\frac{3}{4}\right]$$

for $x<-0.08905$. In the second region, $$f(x)=-6.152x^2+3.9375x$$

where $$-0.08905 \leq x \leq 0.320018.$$

In the third region $f(x)=0.60035$ where $x>0.320018$. Other nonlinear functions work quite well also, and may even be defined piecewise over multiple regions of the domain. The basic constraint on $f(x)$ is that it be a piecewise continuous function defined for every point in the domain.

To summarize briefly, the function f(x) will create foldover noise if applied only once per sample period at a typical audio rate. Utilizing the present invention, f(x) is applied to each of M samples, in a single sample period, to reduce foldover noise.

Figure 15:
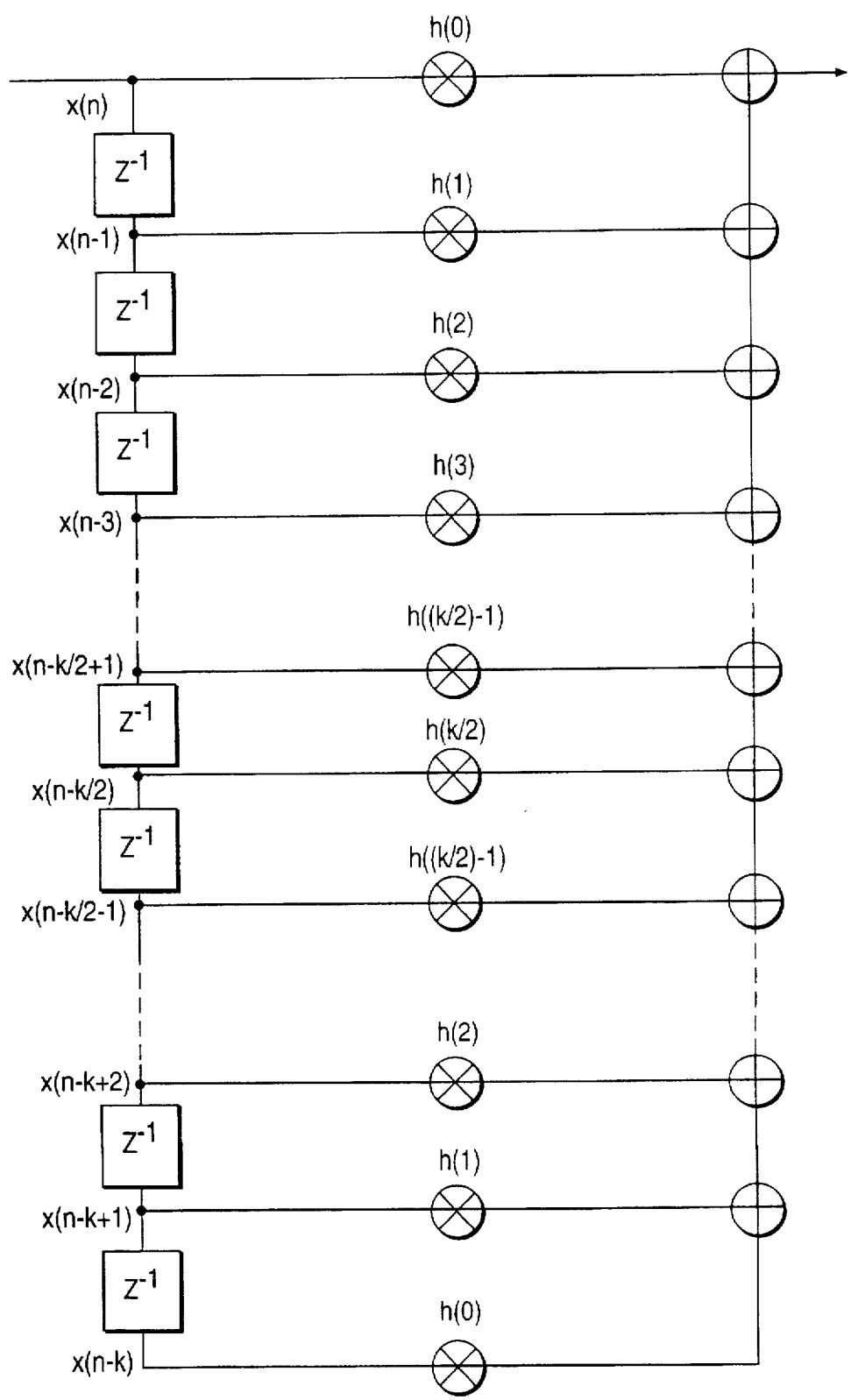
FIG. 15 shows an example of an FIR filter algorithm.

Once a nonlinear function has been applied M times to M different samples, the data comprise a signal that is effectively sampled at a sample rate of $M*F_s$. Preferably, the number of samples is reduced by a factor of 1/M to return to the normal system sampling rate. If the signal were decimated at this point, the high frequency components would still be present, and would cause foldover noise. Hence, the decimation of the signal is similar to the sampling of an analog signal, and is sent through anti-aliasing filter 520. Preferably, a symmetrical finite impulse response (FIR) filter is used to maintain linear phase. DSP texts are replete with information on how to design FIR filters. The present invention utilizes a sin(x)/x function with a Hanning window. The essential quality of anti-alias filter 520 is that it filters any information in the frequency band greater than the original $F_s/2$. A symmetrical FIR filter of length K appropriate for use in the present invention is shown in FIG. 15, where K is an even number. Two good sources for the design of FIR filters are chapter 7 of Oppenheim and Schafer, *Discrete-Time Signal Processing*, and chapter 8 of Proakis and Manolakis, *Digital Signal Processing*, incorporated by reference herein.

Once the oversampled signal has been adequately filtered, it is downsampled in downsampling decimation block 530. Decimation is the process by which one out of every M samples is selected, or M-1 out of every M samples is "decimated," to make up the new data stream, that will be sent to linear effects section 150, as shown in FIG. 3. Preferably, 1 out of every 8 samples is selected. After decimation, the audio signal is back to its original sampling rate of $F_s$, which in the preferred embodiment is 31.2 KHz. A convenience of filtering with anti-alias filter 520 just prior to decimation is that filter 520 needs to be calculated in full only once, with the single output being sent on to the rest of the effects.

Figure 16:
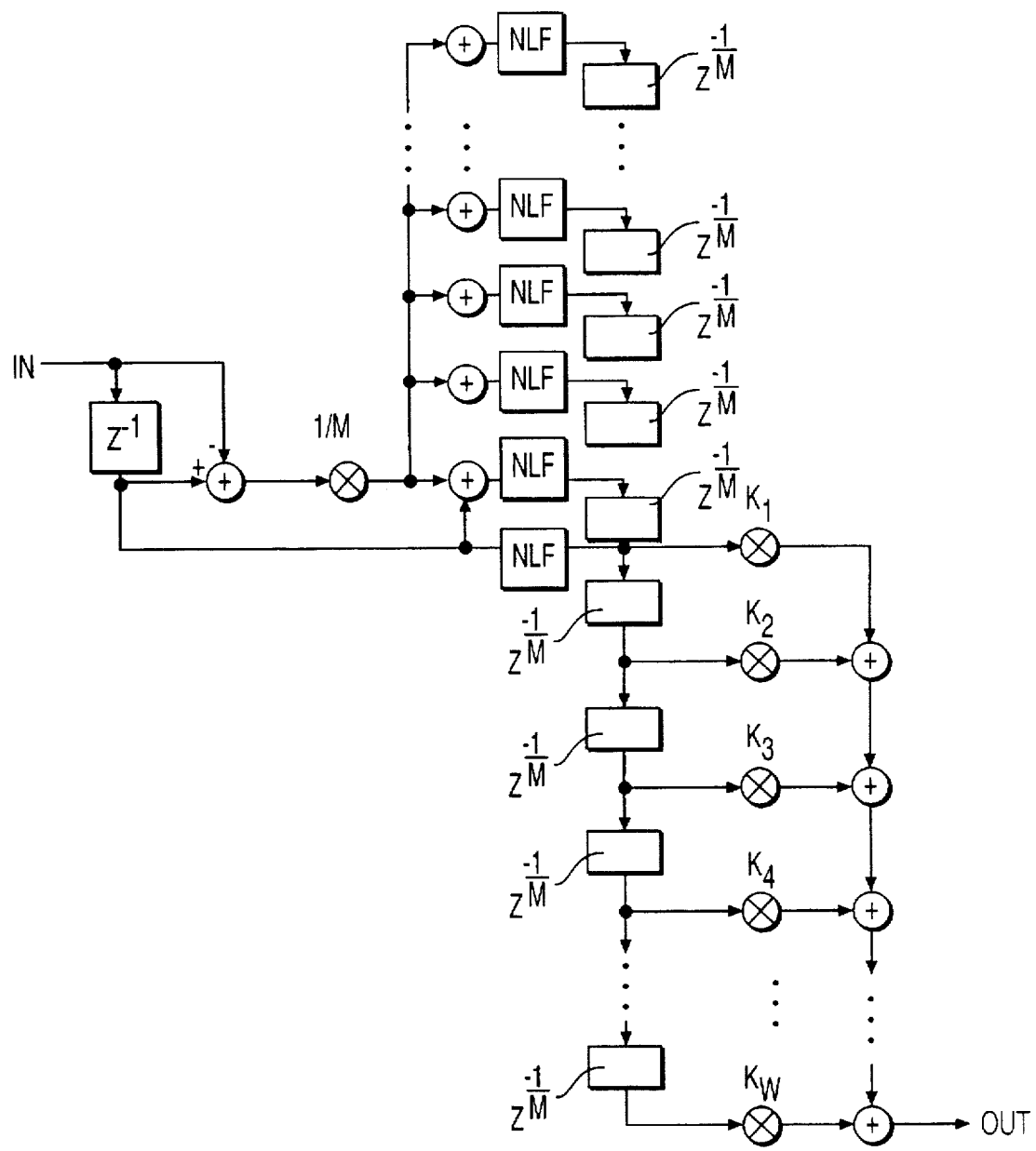
FIG. 16 shows a linear interpolation M-times oversampling algorithm, followed by a nonlinear function executed on M signal values, and filtered with an anti-aliasing W-tap FIR filter, with 1/M decimation to restore the original sampling rate.

Referring to FIG. 16, a DSP algorithm flow diagram for a scheme of M-times oversampling, using a linear interpolation scheme and an anti-aliasing and decimating FIR length of W is shown. The boxes marked "NLF" are nonlinear functions.

Linear chain effects section 150 of FIG. 3 contains functions that are typically found in digital audio instrument processors. These effects include: autovolume (also called "auto swell" or "slow gear"); graphic equalization; tremolo (amplitude modulation); digital delay; chorus; reverberation; stereo spread; and a cabinet simulator filter. There is no reason in principle that these effects must follow the distortion functions, but they are provided here by way of example, and to follow basic stylistic convention.

Figure 17:
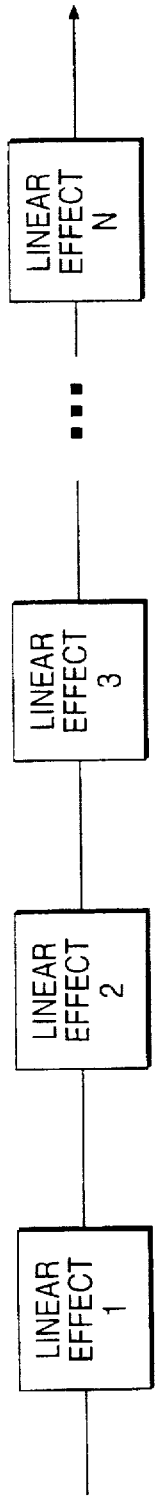
FIG. 17 is a more detailed diagram of a linear effects section from FIG. 3 with N different effects.
Figure 18:
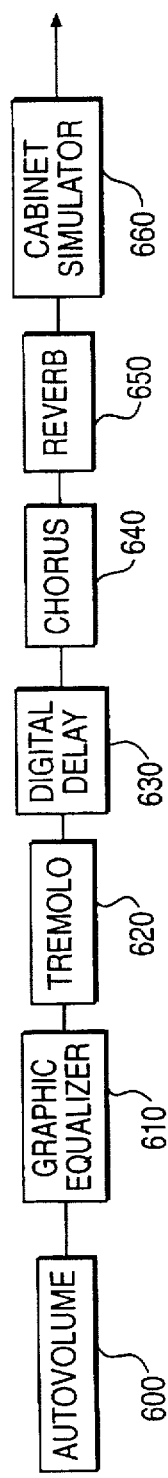
FIG. 18 shows the preferred linear effects section from FIGS. 3 and 17 with a chain of 6 linear effects.
Figure 19:
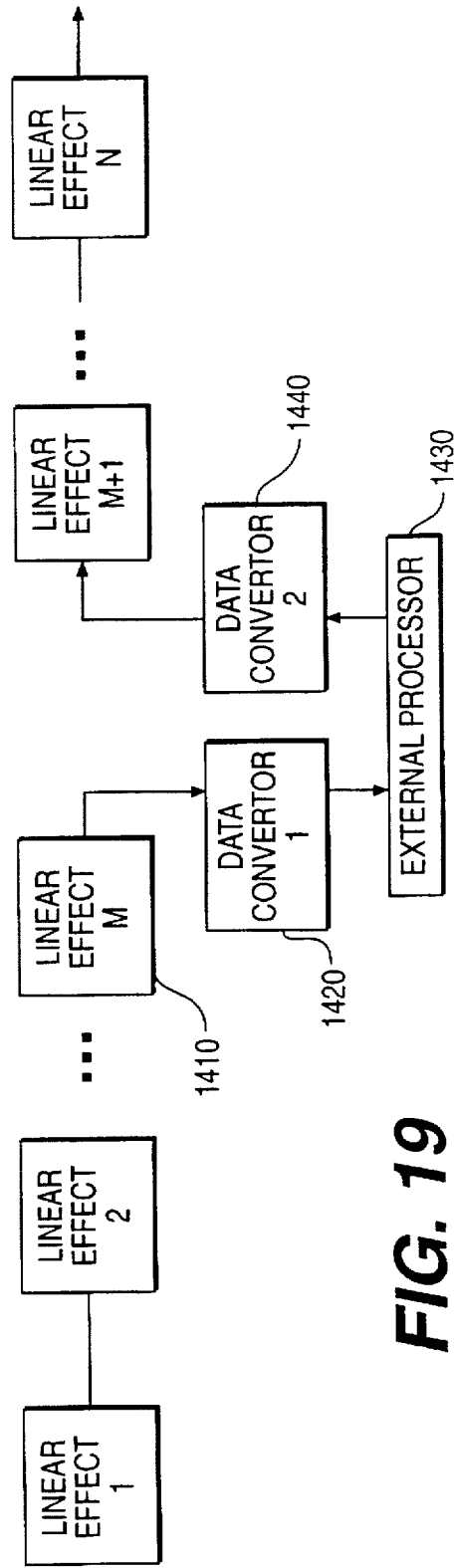
FIG. 19 is a view of a linear effects section having a chain of N different effects, having an external effects loop after the Mth effect in the chain.

A generalized picture of linear effects section, having a chain of N different linear effects, is shown in FIG. 17. A preferred linear effects section, having a chain of 7 linear effects, is shown in FIG. 18. A linear effects section having a chain of N different linear effects may include an effects loop to send data to, and receive data from, external equipment, as shown in FIG. 19. After the first M effects in the chain (where M≦N), the output of preamp effect 1410 number M is sent to an appropriate data converter 1420 whose output is sent to external processor 1430. Data converter 1420 may convert data from digital to analog (DAC), or may merely alter the format of the digital data to a form that is readable by an external processor. Examples of some standard digital formats are S/PDIF, and AES/EBU. External processing 1430 has an output which is sent to an appropriate data converter 1440 whose output is sent to the DSP. Data converter 1440 may convert from analog to digital (A/D), or may merely alter the format of the digital data to a form that is readable by the DSP. Once in the DSP again, the signal is routed through the remaining N-M effects in the chain. The mechanisms which are explained above for an effects loop in the chain of preamp effect apply equally well here.

Referring to FIG. 18, a preferred embodiment illustrating a linear effects section having a chain of seven linear effects includes the following linear effects:

1) Autovolume effect 600 measures the overall level of the input guitar signal, looking for a drastic change in level. Once there is a change in level, the input signal is fully attenuated, and brought up to full level at some exponential rate (the attack rate), creating a bowed string attack effect on the guitar signal.

Figure 24:
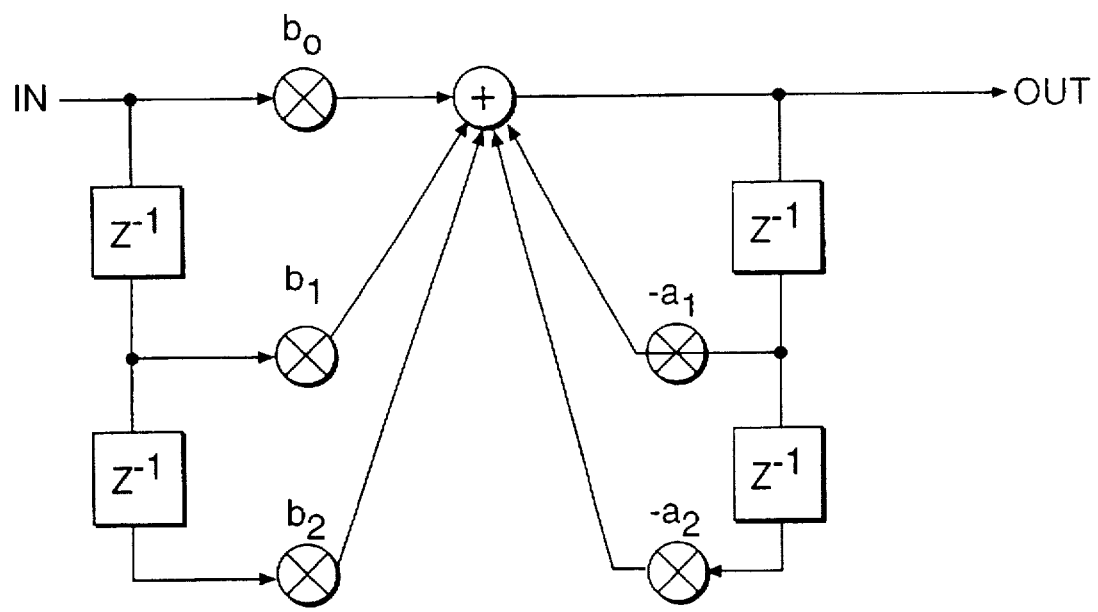
FIG. 24 is the DSP flow diagram of a direct form I bandpass filter.
Figure 25:
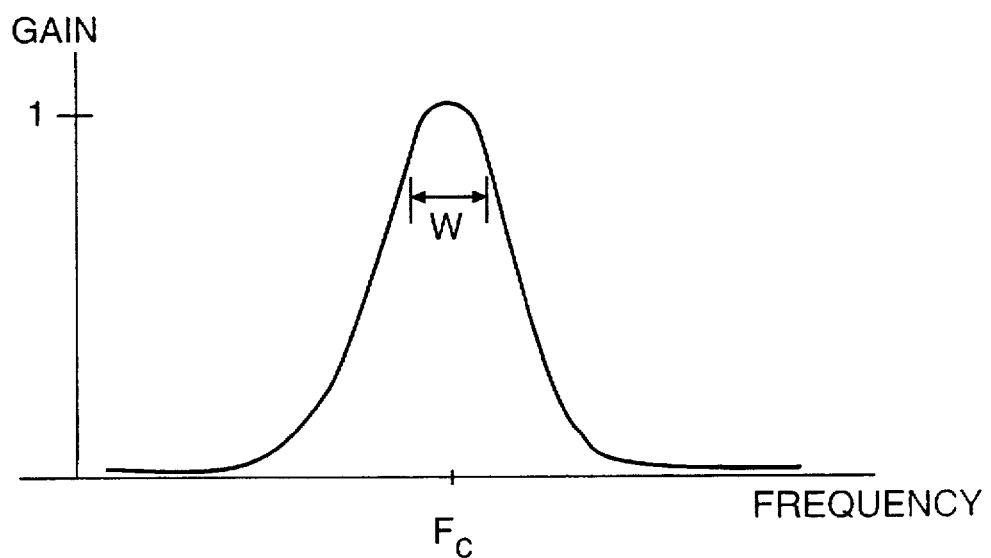
FIG. 25 is the frequency response of the direct form I bandpass filter of FIG. 24.

2) Graphic equalizer 610 is a collection of some number of bandpass filters whose center frequencies are evenly spaced across a range of frequencies. The present invention features a 5-band graphic equalizer. Each band of the graphic equalizer is a standard direct-form I biquad filter with some gain following it. This filter is shown in FIG. 24, and its associated frequency response in FIG. 25. This filter has two parameters, bandwidth (w) and center frequency ($F_c$) and five coefficients a1, a2, b0, b1, and b2, which determine the two filter parameters. There are a variety of ways to calculate these coefficients, but the preferred method is detailed in the Dattorro article cited above. Another article treating the design of bandpass filters, and the usefulness of the direct form I topology is Rhonda Wilson's "Filter Topologies, Journal of the Audio Engineering Society, 41:9 (1993), incorporated by reference herein. These filters are in parallel, rather than series. Examples of this filter design may be found in various DSP texts with a chapter on IIR filter design. Coefficient calculations are made by the microcontroller. Each filter is capable of boosting or cutting frequencies in its band. Examples of this filter design may be found in introductory DSP texts, which almost always have a chapter devoted to IIR filter design. This specific type of filter is found in the Dattorro article cited earlier.

3) Tremolo 620 is a standard guitar amp effect which can become slightly more useful when implemented in stereo. A single LFO is used to control the amplitude of both channels—either in unison (mono mode) or in a complementary fashion (stereo mode). Furthermore, the LFO signal can be hard-clipped to varying degrees to provide a range from smoothly shifting tremolo to hard on/off style tremolo.

4) Digital delay 630 outputs its input signal after some specified length of time, or rather after some specified number of samples. Most digital delays allow the user to mix the signal levels of the delay output and the delay input. This is a very musically useful effect, and simple to implement digitally. For some sample number n, a delay of 3 will output the sample that occurred three samples ago, that is sample numbered n-3. The implementation of the delay requires a circular buffer, which is a device that moves data like a fireman's bucket brigade moves buckets of water. Consider the case of a delay of length N samples. With each new sample received (say sample number n), the circular buffer effectively stores the new sample data to the location where sample n-1 was stored, which in turn stores that sample data to where n-2 was stored, and so on, until we arrive at sample n-N which is the output by the delay. Preferably, the value of N can be up to 40,000 samples which is approximately equivalent to a 1.2 second delay.

5) Chorus 640 is a delay line whose length is not fixed, but is modulated with a LFO. In both devices, the preferred implementation is on a DSP device that has built-in circuitry for circular buffers, making implementation highly efficient.

6) Artificial reverberation 650 (often called simply "reverb") is an effect that simulates the torrent of echoes and acoustic reflections from various surfaces in a listening space, thereby providing a spatial ambiance to the musical signal. Reverb effects are constructed with a combination of allpass filters and comb filters. Typically, the comb filter delays are of lengths which have no common multiples, that is to say the lengths are relatively prime, to avoid a buildup of power at specific resonant frequencies. Furthermore, reverb effects will often have large feedback loops for long sustaining reverberation. In general, more signal processing resources allow the reverb designer to construct a higher quality reverb. When signal processing is limited, as in the present invention, the preferred embodiment has fewer all-pass filters, and fewer comb filters, used in series combinations, for each channel. There are no hard and simple rules to the design of reverb effects, and it is an activity that is highly empirical and subjective. Useful basic reverb designs may be found in Moorer, James A., "About This Reverberation Business," Computer Music Journal, 3:2 (1979) at 13–28; and Stauner and Puckette, "Designing Multi-Channel Reverberators," Computer Music Journal, 6:1 (1982), incorporated by reference herein.

7) Cabinet Simulator 660 emulates the effects of several types of speaker cabinets on the amplified sound. In general, a speaker cabinet will roll off the higher frequencies, providing a greater bass frequency presence. The cabinet simulator effect is basically a lowpass filter, as described above in the discussion on the filter used to construct the bright switch. For a more drastic lowpass effect, two such lowpass filters may be used in series.

Having described and illustrated the principles of our invention with reference to a preferred embodiment, it will be apparent that the invention can be modified in arrangement and detail without departing from such principles. As such, it should be recognized that the detailed embodiment is illustrative only and should not be taken as limiting the scope of our invention. Rather, we claim as our invention all such embodiments as may fall within the scope and spirit of the following claims and equivalents thereto.

We claim:

1. A digital guitar amplifier contained in a portable housing to digitally process audio signals comprising:

means for converting an audio signal from a first analog signal to a digital signal;

means for digitally processing said digital signal to emulate an analog guitar amplifier;

means for converting said digital signal to a second analog signal;

means for amplifying said second analog signal; and means for driving said analog signal through loudspeakers.

2. A digital guitar amplifier as in claim 1 wherein said means for digitally processing said digital signal emulates an analog guitar amplifier without foldover noise.

3. A digital guitar amplifier as in claim 1 wherein said means for digitally processing said digital signal emulates an analog guitar amplifier without aliasing artifacts.

4. A digital guitar amplifier as in claim 1 wherein said means for digitally processing said digital signal to emulate an analog amplifier further comprises:

a preamp effects section;

a non-linear effects section;

a linear effects section.

5. A digital guitar amplifier as in claim 4 wherein said preamp effects section comprises a chain of preamp effects selected from the group consisting of: phase-shifter, dynamic compressor, wah effect, hum canceller, noise gate, and bright switch, and volume control.

6. A digital guitar amplifier as in claim 4, wherein said preamp effects section further comprises at least one effects loop in the chain of preamp effects for processing by external devices.

7. A digital guitar amplifier as in claim 4, wherein said linear effects section comprises a chain of linear effects selected from the group consisting of: autovolume, graphic equalizer, chorus, tremolo, digital delay, reverberation, chorus, and cabinet simulator.

8. A digital guitar amplifier as in claim 4 wherein said linear effects section further comprises at least one effects loop in the chain of linear digital effects for processing by external devices.

9. A digital guitar amplifier as in claim 4 wherein said nonlinear effects section further comprises:

means for oversampling and interpolating said digital signal;

means for amplifying said digital signal in a non-linear fashion;

means for filtering said digital signal; and means for downsampling said digital signal.

10. A digital guitar amplifier as in claim 9 wherein said means for amplifying said digital signal further comprises the use of a non-linear transfer function.

11. A digital guitar amplifier as in claim 10 wherein said non-linear transfer function is selected from the group consisting of:

$$f(x)=(12x!-x^2)\sin(x)$$

where $\sin(x)=1$ if $x>0$ and $\sin(x)=-1$ otherwise;

$$f(x) \begin{cases} Kx & \text{if } |x| < \text{MaxValue} \\ \sin(x) \cdot K \cdot \text{MaxValue} & \text{otherwise} \end{cases};$$

and $$f(x) = -\left[\frac{3}{4}\right]$$

for $$x<-0.08905, f(x)=-6.152x^2+3.9375x$$

for $$-0.08905 \leq x \leq 0.320018,$$

and $f(x)=0.60035$ for $x>0.320018$.

12. A digital guitar amplifier as in claim 9 wherein said means for oversampling further comprises:

means for sampling at a sampling rate of 31.2 kHz; and means for oversampling said analog signal by 8 times.

13. A digital guitar amplifier as in claim 9 wherein said means for oversampling creates an effective sampling rate of 249.6 kHz.

14. A digital guitar amplifier as in claim 9 wherein said means for interpolating further comprises the use of linear interpolation.

15. A digital guitar amplifier as in claim 9 wherein said means for downsampling further comprises selecting 1 out of every 8 samples.

16. A digital guitar amplifier as in claim 9 wherein said means for filtering further comprises a symmetrical FIR filter.

17. A method of digitally amplifying an analog guitar audio signal in a portable housing unit comprising the steps of:

converting an audio signal from an analog signal to a digital signal;

digitally processing with a microcontroller said digital signal so as to emulate an analog guitar amplifier;

converting said digital signal to an analog signal;

amplifying said analog signal; and driving said analog signal through loudspeakers.

18. A digital guitar amplifier in a portable housing unit to digitally process audio signals comprising:

an input jack for output from a musical instrument;

at least one loudspeaker;

a plurality of buttons and knobs for programming and storing program selections;

a display for displaying selected programs;

an analog to digital converter for converting an analog signal from said musical instrument to a digital signal;

digital circuitry including a microcontroller for generating preamp effects, non-linearly amplifying said digital signal and generating linear effects;

a digital to analog converter for converting said digital signal to a second analog signal;

an amplifier for amplifying said second analog signal; and a driver to drive said second analog signal through said at least one loudspeaker.

19. A digital guitar amplifier as in claim 18 wherein said digital circuitry further comprises:

computer readable code for oversampling and interpolating said digital signal;

computer readable code for applying a non-linear transfer function to oversampled and interpolated digital signal which nonlinearly amplifies said digital signal; and computer readable code for filtering and downsampling said nonlinearly amplified signal.

20. A digital guitar amplifier as in claim 18 wherein said digital circuitry further comprises computer readable code for implementing preamp effects selected from the group consisting of: phase-shifter, dynamic compressor, wah effect, hum canceller, noise gate, and bright switch, and volume control.

21. A digital guitar amplifier as in claim 19 wherein said computer readable code for applying a non-linear transfer function is selected from the group consisting of:

$$f(x)=(|2x|-x^2)\ \text{sign}(x)$$

where sin(x)=1 if x>0 and sin(x)=otherwise;

$$f(x) = \begin{cases} Kx & \text{if } |x| < \text{MaxValue} \\ \sin(x) \cdot K \cdot \text{MaxValue} & \text{otherwise} \end{cases} ;$$

and $$f(x) = -\left[\frac{3}{4}\right]$$

for $$x<-0.08905,\ f(x)=-6.152x^2+3.9375x$$

for $-0.08905 \leq x < 0.320018$, and f(x)=0.60035 for x>0.320018.

22. A digital guitar amplifier as in claim 19 wherein said computer readable code for oversampling further comprises computer readable code for sampling at a sampling rate of 31.2 kHz and oversampling said analog signal by 8 times.

23. A digital guitar amplifier as in claim 19 wherein said computer readable code for interpolating further comprises computer readable code for linear interpolation.

24. A digital guitar amplifier as in claim 18 wherein said digital circuitry further comprises computer readable code for implementing linear effects selected from the group consisting of: autovolume, graphic equalizer, chorus, tremolo, digital delay, reverberation, chorus, and cabinet simulator.

25. A digital guitar amplifier as in claim 19 wherein said computer readable code for filtering further comprises computer readable code for applying a symmetrical FIR filter.

26. A digital guitar amplifier as in claim 19 wherein said computer readable code for downsampling further comprises computer readable code which selects 1 out of every 8 samples.

27. A digital audio amplification system for digitally emulating a tube amplification system, comprising:

means for digitally processing an input digital signal sampled at a first sampling rate by sampling and interpolating at least a portion of said input digital signal at a second sampling rate to produce an oversampled digital signal, said second sampling rate being a predetermined multiple of said first sampling rate;

means for applying at least one nonlinear transfer function to said oversampled digital signal to produce a nonlinear oversampled digital signal;

means for filtering said nonlinear oversampled digital signal to produce a filtered nonlinear oversampled digital signal with substantially reduced aliasing frequencies; and means for decimating said filtered nonlinear oversampled digital signal to output said filtered non-linear oversampled digital signal at said first sampling rate.

28. The system of claim 27, wherein said oversampled digital signal includes a set of samples.

29. The system of claim 28, wherein said at least one nonlinear transfer function is applied to each sample of said set of samples.

30. The system of claim 27, wherein said nonlinear transfer function is selected from a plurality of predetermined nonlinear transfer functions selected for modeling at least one of preselected tube amplifier.

31. The system of claim 30, wherein said plurality of predetermined nonlinear transfer functions include at least one of:

(1) $f(x)=(|2x|-x^2)\sin(x)$, where sin(x)=1 if x>0, and sin(x)=-1 otherwise;

(2) $f(x)=Kx$ if $|x|<\text{MaxValue}$, and $\sin(x)\cdot K\cdot\text{MaxValue}$ otherwise; or (3) First region: $f(x)=-\frac{3}{4}$ for $x<-0.08905$;

Second region: $f(x)=-6.152x^2+3.9375x$, where $-0.08905 \leq x \leq 0.320018$; and Third region: $f(x)=0.060035$, where $x>0.320018$.

32. The system of claim 30, wherein a tube distortion effect is sustained over a range of volume levels.

33. The system of claim 30, further comprising a programming means for allowing a user to program specific tonal configurations using at least one of said predetermined nonlinear transfer functions.

34. The system of claim 27, wherein said predetermined multiple is an integral multiple.

35. The system of claim 27, wherein said filtering means includes an anti-aliasing filter.

36. A digital audio amplification system for digitally emulating a tube amplification system, comprising:

- at least one input device for receiving an analog input signal from an external audio device;
- an analog-to-digital converter for converting said analog input signal to a digital signal at a first sampling rate;
- a microcontroller connected with an output of said analog-to-digital converter for receiving said digital signal;
- digital processing circuitry connected with said microcontroller for generating at least one of a preamplification effect, a nonlinear effect and a linear effect on said digital signal, said nonlinear effect including sampling said digital signal at a second sampling rate which is a predetermined multiple of said first sampling rate;
- a digital-to-analog converter for converting said digital signal to an analog output signal; and
- an output device for audibilizing said analog output signal.

37. The system of claim 36, wherein said preamplification effect includes at least one of a bright switch, a presence control, a tone control, mono and stereo tremolo, a drive control, and graphic equalization.

38. The system of claim 36, wherein said linear effect includes at least one of stereo rotary speaker effects, mono and stereo chorusing and flanging, reverberation, and delay effects.

39. The system of claim 36, further comprising a universal asynchronous receiver and transmitter connected with said microcontroller to provide a musical instrument digital interface with external audio devices.

40. The system of claim 36, wherein said output device includes an amplifier for amplifying said analog output signal, and at least one speaker.

41. The system of claim 36, further comprising an auxiliary input device for receiving an audio signal from a second external audio device.

42. The system of claim 41, wherein said auxiliary input device includes dedicated equalization and reverberation controls.

43. A method for digitally emulating the tonal characteristics of a tube amplification system, comprising the steps of:

- digitally processing an input digital signal sampled at a first sampling rate by sampling and interpolating at least a portion of said input digital signal at a second sampling rate to produce an oversampled digital signal, said second sampling rate being a predetermined multiple of said first sampling rate;
- applying at least one nonlinear transfer function to said oversampled digital signal to produce a nonlinear oversampled digital signal;
- filtering said nonlinear oversampled digital signal to produce a filtered nonlinear oversampled digital signal with substantially reduced aliasing frequencies; and
- decimating said filtered non linear oversampled digital signal to output said filtered nonlinear oversampled digital signal at said first sampling rate.
- wherein said input digital signal is sampled at said second sampling rate chosen to emulate at least one of a specific predetermined set of tube amplifier characteristics.

44. The method of claim 43, wherein said interpolating step includes a linear interpolation method.

45. The method of claim 44, wherein said linear interpolation method includes a zero insertion method.

* * * * *